United States Patent
Herr et al.

(10) Patent No.: US 11,159,168 B2
(45) Date of Patent: Oct. 26, 2021

(54) SUPERCONDUCTING NON-DESTRUCTIVE READOUT CIRCUITS

(71) Applicants: Anna Y. Herr, Ellicott City, MD (US); Quentin P. Herr, Ellicott City, MD (US); Ryan Edward Clarke, Hanover, MD (US); Harold Clifton Hearne, III, Baltimore, MD (US); Alexander Louis Braun, Baltimore, MD (US); Randall M. Burnett, Catonsbille, MD (US); Timothy Chi-Chao Lee, Gaithersburg, MD (US)

(72) Inventors: Anna Y. Herr, Ellicott City, MD (US); Quentin P. Herr, Ellicott City, MD (US); Ryan Edward Clarke, Hanover, MD (US); Harold Clifton Hearne, III, Baltimore, MD (US); Alexander Louis Braun, Baltimore, MD (US); Randall M. Burnett, Catonsbille, MD (US); Timothy Chi-Chao Lee, Gaithersburg, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 17/094,452

(22) Filed: Nov. 10, 2020

(65) Prior Publication Data

US 2021/0083676 A1 Mar. 18, 2021

Related U.S. Application Data

(62) Division of application No. 16/700,615, filed on Dec. 2, 2019, now Pat. No. 10,868,540, which is a division
(Continued)

(51) Int. Cl.
*H03K 19/195* (2006.01)
*G06N 10/00* (2019.01)
(Continued)

(52) U.S. Cl.
CPC .......... *H03K 19/195* (2013.01); *G06N 10/00* (2019.01); *G11C 11/44* (2013.01); *H03K 3/38* (2013.01)

(58) Field of Classification Search
CPC ........ H03K 19/195; H03K 3/38; G06N 10/00; G11C 11/44; G11C 8/16
See application file for complete search history.

(56) References Cited

U.S. PATENT DOCUMENTS 3,094,685 A 6/1963 Crowe
4,360,898 A 11/1982 Faris
(Continued)

FOREIGN PATENT DOCUMENTS

CN 101626233 A 1/2010
CN 101626234 A 1/2010
(Continued)

OTHER PUBLICATIONS

Canadian Office Action for Application No. 3072188 dated Mar. 29, 2021.
(Continued)

*Primary Examiner* — Daniel D Chang
(74) *Attorney, Agent, or Firm* — Tarolli, Sundheim, Covell & Tummino LLP

(57) ABSTRACT

Non-destructive read out (NDRO) circuits are provided for use in reciprocal quantum logic (RQL) superconducting systems. Each NDRO circuit includes a "body" circuit that provides a single or multi-state sub-critical bias current to one or many independent "tail" circuitries. Each "tail" has minimal effect on the "body" thereby preventing any inter-
(Continued)

ference or destruction to the state of the "body" circuitry. The circuits reduce device count and thereby increase circuit density, simplify and reduce the cost of fabrication, and provide functionality not available in existing designs, such as the ability to write a state and read it in the same operation cycle. The NDRO circuits provide more compact unit cells useful in memory or logic arrays, demanding fewer resources with increased functionality. The circuits also provide compact cells for AND, AND-OR, A-NOT-B, inverter, multiplexer, and demultiplexer gates.

17 Claims, 16 Drawing Sheets

Related U.S. Application Data of application No. 16/051,058, filed on Jul. 31, 2018, now Pat. No. 10,554,207.

(51) Int. Cl.
*G11C 11/44* (2006.01)
*H03K 3/38* (2006.01)

(56) References Cited

U.S. PATENT DOCUMENTS

| | | | |
|---|---|---|---|
| 4,633,439 A | 12/1986 | Harada et al. | |
| 4,956,642 A | 9/1990 | Harada | |
| 5,233,243 A | 8/1993 | Murphy et al. | |
| 5,250,859 A | 10/1993 | Kaplinsky | |
| 5,323,344 A | 6/1994 | Katayama et al. | |
| 6,104,764 A | 8/2000 | Ohta et al. | |
| 6,310,488 B1 | 10/2001 | Hasegawa et al. | |
| 6,420,895 B1 | 7/2002 | Herr et al. | |
| 6,608,518 B2 | 8/2003 | Furuta et al. | |
| 6,734,699 B1 | 5/2004 | Herr et al. | |
| 6,756,925 B1 | 6/2004 | Leung et al. | |
| 6,781,435 B1 | 8/2004 | Gupta et al. | |
| 7,129,869 B2 | 10/2006 | Furuta et al. | |
| 7,227,480 B2 | 6/2007 | Furuta et al. | |
| 7,501,877 B2 | 3/2009 | Furuta et al. | |
| 7,554,369 B2 | 6/2009 | Kirichenko | |
| 7,724,020 B2 | 5/2010 | Herr | |
| 7,786,748 B1 | 8/2010 | Herr | |
| 7,786,786 B2 | 8/2010 | Kirichenko | |
| 7,903,456 B2 | 3/2011 | Kirichenko et al. | |
| 7,944,253 B1 | 5/2011 | Kirichenko | |
| 7,969,178 B2 | 6/2011 | Przybysz et al. | |
| 7,975,195 B1 | 7/2011 | Joshi et al. | |
| 7,975,795 B2 | 7/2011 | Asano | |
| 7,977,964 B2 | 7/2011 | Herr | |
| 7,991,814 B2 | 8/2011 | Filippov et al. | |
| 8,022,722 B1 | 9/2011 | Pesetski et al. | |
| 8,138,784 B2 | 3/2012 | Przybysz et al. | |
| 8,489,163 B2 | 7/2013 | Herr et al. | |
| 8,571,614 B1 | 10/2013 | Mukhanov et al. | |
| 8,611,974 B2 | 12/2013 | Maibaum et al. | |
| 9,355,364 B2 | 5/2016 | Miller et al. | |
| 9,455,707 B2 | 9/2016 | Herr et al. | |
| 9,473,124 B1 | 10/2016 | Mukhanov et al. | |
| 9,543,959 B1 | 1/2017 | Carmean et al. | |
| 9,595,969 B2 | 3/2017 | Miller et al. | |
| 9,595,970 B1 | 3/2017 | Reohr et al. | |
| 9,646,682 B1 | 5/2017 | Miller et al. | |
| 9,712,172 B2 | 7/2017 | Shauck et al. | |
| 9,780,765 B2 | 10/2017 | Naaman et al. | |
| 9,812,192 B1 | 11/2017 | Burnett et al. | |
| 9,864,005 B1 | 1/2018 | Carmean et al. | |
| 9,876,505 B1 | 1/2018 | Dai et al. | |
| 9,887,700 B2 | 2/2018 | Carmean et al. | |
| 9,905,900 B2 | 2/2018 | Herr et al. | |
| 9,917,580 B2 | 3/2018 | Naaman | |
| 9,972,380 B2 | 5/2018 | Ambrose | |
| 10,074,056 B2 | 9/2018 | Epstein | |
| 10,084,454 B1 | 9/2018 | Braun et al. | |
| 10,090,841 B1 | 10/2018 | Herr | |
| 10,103,735 B1 | 10/2018 | Herr | |
| 10,103,736 B1 | 10/2018 | Powell, III et al. | |
| 10,147,484 B1 | 12/2018 | Braun | |
| 10,158,348 B1 | 12/2018 | Braun | |
| 10,158,363 B1* | 12/2018 | Braun | H03K 19/195 |
| 10,171,087 B1 | 1/2019 | Braun | |
| 10,311,369 B2 | 6/2019 | Epstein | |
| 10,355,696 B1 | 7/2019 | Herr | |
| 10,389,361 B1 | 8/2019 | Powell, III et al. | |
| 10,547,314 B1 | 1/2020 | Braun | |
| 10,554,207 B1 | 2/2020 | Herr et al. | |
| 10,615,783 B2 | 4/2020 | Powell, III et al. | |
| 10,650,319 B2 | 5/2020 | Medford | |
| 11,010,686 B2 | 5/2021 | Medford | |
| 2003/0011398 A1 | 1/2003 | Herr | |
| 2003/0016069 A1 | 1/2003 | Furuta et al. | |
| 2003/0055513 A1 | 3/2003 | Raussendorf et al. | |
| 2004/0022332 A1 | 2/2004 | Gupta et al. | |
| 2005/0224784 A1 | 10/2005 | Amin et al. | |
| 2006/0290553 A1 | 12/2006 | Furuta et al. | |
| 2007/0077906 A1 | 4/2007 | Kirichenko et al. | |
| 2007/0174227 A1 | 7/2007 | Johnson et al. | |
| 2008/0186064 A1 | 8/2008 | Kirichenko | |
| 2008/0231353 A1 | 9/2008 | Filippov et al. | |
| 2009/0002014 A1 | 1/2009 | Gupta et al. | |
| 2009/0153180 A1 | 6/2009 | Herr | |
| 2009/0153381 A1 | 6/2009 | Kirichenko | |
| 2009/0289638 A1 | 11/2009 | Farinelli et al. | |
| 2009/0319757 A1 | 12/2009 | Berkley | |
| 2010/0033206 A1 | 2/2010 | Herr et al. | |
| 2011/0133770 A1 | 6/2011 | Przybysz et al. | |
| 2011/0267878 A1 | 11/2011 | Herr et al. | |
| 2012/0184445 A1 | 7/2012 | Mukhanov et al. | |
| 2013/0040818 A1 | 2/2013 | Herr et al. | |
| 2014/0118024 A1 | 5/2014 | Eastin | |
| 2014/0223224 A1 | 8/2014 | Berkley | |
| 2015/0094207 A1 | 4/2015 | Herr et al. | |
| 2015/0111754 A1 | 4/2015 | Harris et al. | |
| 2015/0254571 A1 | 9/2015 | Miller et al. | |
| 2015/0349780 A1 | 12/2015 | Naaman et al. | |
| 2016/0013791 A1 | 1/2016 | Herr et al. | |
| 2016/0034609 A1 | 2/2016 | Herr et al. | |
| 2016/0125102 A1 | 5/2016 | Shauck et al. | |
| 2016/0164505 A1 | 6/2016 | Naaman et al. | |
| 2016/0189053 A1 | 6/2016 | Alboszta et al. | |
| 2017/0117901 A1 | 4/2017 | Carmean et al. | |
| 2017/0359072 A1 | 12/2017 | Hamilton et al. | |
| 2019/0149139 A1 | 5/2019 | Braun | |
| 2020/0106444 A1 | 4/2020 | Herr et al. | |

FOREIGN PATENT DOCUMENTS

| | | |
|---|---|---|
| EP | 0061930 A2 | 10/1982 |
| EP | 2430759 B1 | 7/2015 |
| JP | S58135141 A | 8/1983 |
| JP | S60163487 A | 8/1985 |
| JP | H03167919 A | 7/1991 |
| JP | H08148989 A | 6/1996 |
| JP | 2000124794 A | 4/2000 |
| JP | 2001504647 A | 4/2001 |
| JP | 1996172352 A | 11/2001 |
| JP | 2002344306 A | 11/2002 |
| JP | 2006165812 A | 6/2006 |
| JP | 2012064622 A | 3/2012 |
| JP | 2012527158 A | 11/2012 |
| JP | 2013529380 A | 7/2013 |
| JP | 2014529216 A | 10/2014 |
| WO | 2008/089067 A1 | 7/2008 |
| WO | 2010132074 A1 | 11/2010 |
| WO | 2012/174366 A1 | 12/2012 |
| WO | 2013/025617 A1 | 2/2013 |
| WO | 2014/028302 A2 | 2/2014 |
| WO | 2016007136 A1 | 1/2016 |
| WO | 2018075106 A1 | 4/2018 |

(56) References Cited

FOREIGN PATENT DOCUMENTS

OTHER PUBLICATIONS

A. Laucht, et al., "electrically controlling single-spin qubits in a continuous microwave field", Science, vol. 1, No. 3 Apr. 10, 2015, pp. e150002-e1500022, XP055267170, US ISSN: 0036-8075, DOI: 10.14126/sciadv.1500022 *the whole document*.

Bacon et al., "Adiabatic Gate Teleportation", arxiv.org, Cornell University Library, 201 Olin Library Cornell University Ithaca, Ny 14853 (May 6, 2009), doi: 10.1103/PHYSERVLETT.103.120504, Claims 1-20.

Barlett, S. D. et al., "Simple nearest-neighbor two-body", Physical Review A (Atomic, Molecular, and Optical, vol. 74, No. 4, pp. 40302-1, DOI: 10.1103/PHYSREVA.74.040302, Oct. 24, 2006 {Oct. 24, 2006).

Burm Baek et al., 'Hybrid superconducting-magnetic memory device using competing order parameters,' Nature Communications, vol. 5, May 2014.

Dicarlo L, et al., "Demonstration of Two-Qubit Algorithms with a Superconducting Quantum Porcessor", arxiv.org, Cornell University Library, 201 Olin Library Cornell University Ithaca, NY 14853, Mar. 11, 2009, XP080314862, DOI: 10.1038/NATURE08121 *the whole document*.

Grajcar et al, "Direct Josephson coupling between superconducting flux qubits", arxiv.org, Cornell University Library, 201 Olin Library Cornell University Ithaca, NY 14853, Jan. 5, 2005, XP080187009, DOI: 10.1103/PHYSERVB.72.020503, figure 5.

Jerger M, et al., "Frequecy division multiplexing readout and simultaneous manipulation of an array of flux quibts", Applied Physics Letters, AIP Publicsing LLC, US, vol. 101, No. 4, Jul. 23, 2012, pp. 42604-42604, XP012164086, ISSN: 0003-6951, DOI: 10.1063/1.4739454 [retrieved on Jul. 27, 2012] *pp. 042604-1-pp. 042604-3*.

Jian Le, et al, "Operation of a phase qubit as a quantum switch", arxiv.org, Cornell University Library, 201 Olin Library Cornell University Ithaca, NY 14853, Mar. 14, 2011, SP080543914, DOI: 10.1038/SREP00645 *pae 1-p. 3, right-hand column, paragraph 3*.

Jian Li, et al., "Dynamical Autler-Townes control of a phase qubit", Scientific Reports, vol. 2, Dec. 11, 2012, XP055268241, DOI: 10.1038/srep00654 'p. 1-p. 6, right-hand column, paragraph 2*.

Li, et al. "Dynamical Autler-Townes control of a phase qubit" Scientific Reports, vol. 2, Dec. 11, 2012, XP055268241, DOI: 10.1038/srep00645.

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

Nowka, "High-Performance CMOS system Design Using Wave Pipelining", Sematantic Scholar, https;//www.semanticscolar.org/paper/High-Performance-CMOS-System-Design-Using-Wave-Nowka/a5ef4cd1e69cae058f162a9a8bf085b027d35f0c, Jan. 31, 1996 (Jan. 31, 1996).

Okabe, et al., "Boolean Single Flux Quantum Circuits", IEICE Transactions on Electronics, Institute of Electronics, Tokyo, JP, vol. E84-C, No. 1, Jan. 1, 2001, pp. 9-14, XP001003211, ISSN: 0916-8524, Sections 3.2 and 3.4; figures 5, 11.

Rabi frequency https://en.wikipedia.org/wiki/Rabi_frequency (Year: NA).

Richard H Warren: "Gates for Adiabatic Quantum Computing", Aug. 26, 2014 (Aug. 26, 2014), XP055438870.

The formula for the dot product in terms of vector components https;//mathinsight.org/dot_product_formula_components (Year: NA).

Warren, R. H., "Gates for Adiabatic Quantum Computing", Cornell University Library, https://arxiv.org/ftp/arxiv/papers/1405/1405.2354.pdf, Aug. 26, 2014 (Aug. 26, 2014).

Non Final Office Action for U.S. Appl. No. 16/839,011 dated Oct. 14, 2020.

Korean Office Action for Application No. 10-2018-7027661 dated Sep. 24, 2020.

Australian Examination Report for Application No. 2018364954 dated Oct. 13, 2020.

Australian Examination Report for Application No. 2018364955 dated Oct. 21, 2020.

Canadian Office Action for Application No. 3032557 dated Nov. 5, 2020.

Canadian Office Action for Application No. 3032085 dated Nov. 9, 2020.

Barlett, S. D. et al., "A simple nearest-neighbor two-body Hamiltonian system for which the ground state is a universal resource for quantum computation", physical review a (Atomic, Molecular, and Optical), vol. 74, No. 4, pp. 40302-1, DOI: 10.1103/Physreva.74.040302, Oct. 24, 2006.

Japanese Office Action for Application No. 2018-549958 dated Nov. 4, 2020.

Australian Examination Report for Application No. 2018634954 dated Dec. 2, 2020.

Korean Office Action for Application No. 10-2020-7012934 dated Feb. 23, 2021.

Japanese Office Action for Application No. 2020-517892 dated Feb. 16, 2021.

Japanese Office Action for Application No. 2020-517893 dated Feb. 16, 2021.

Japanese Office Action for Application No. 2020-518629 dated Mar. 16, 2021.

Japanese Office Action for Application No. 2020-518711 dated Mar. 16, 2021.

International Search Report for Application No. PCT/US2012/023742 dated Jul. 7, 2021.

Fourie CJ et al: "A Single-Clock Asynchronous Input COSL Set-Reset Flip-Flop and SFQ to Voltage State Interface", IEEE Transactions on Applied Superconductivity, IEEE Service Center, Los Alamitos, CA, US, vol. 15, No. 2, Jun. 1, 2005 (Jun. 1, 2005), pp. 263-266.

Examination Report from corresponding Australian Patent Application No. 2019313237, dated Aug. 4, 2021.

* cited by examiner

SUPERCONDUCTING NON-DESTRUCTIVE READOUT CIRCUITS

GOVERNMENT INTEREST

The invention was made under Government Contract Number W911NF-14-C-0115. Therefore, the US Government has rights to the invention as specified in that contract.

RELATED APPLICATIONS

This application claims priority to U.S. patent application Ser. No. 16/700,615, filed on Dec. 2, 2019, which claims priority to U.S. patent application Ser. No. 16/051,058, filed Jul. 31, 2018, which issued as U.S. Pat. No. 10,554,207 on Feb. 4, 2020, and which is incorporated herein in its entirety.

TECHNICAL FIELD

The present invention relates generally to quantum and classical digital superconducting circuits, and specifically to superconducting non-destructive readout circuits.

BACKGROUND

In the field of digital logic, extensive use is made of well known and highly developed complementary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions, with typical signal power of around 4 nanowatts (nW), at a typical data rate of 20 gigabits per second (Gb/s) or greater, and operating temperatures of around 4 kelvins.

A non-destructive readout (NDRO) circuit is a circuit that can retrieve a stored information state (e.g., one or multiple bits) for transmission to other circuitry for processing or output without erasing, destroying, changing, or otherwise corrupting the stored information state. For the purposes of this application, the term should not be interpreted to include circuits that destructively retrieve a stored information state but then thereafter perform a restorative write-back.

Latches and flip-flops are circuits that can be used to store state information and to change state by signals applied to one or more control inputs. In modern computing and communications electronics, these are basic storage elements in memories and sequential logic. A latch is asynchronous, with its output changing as soon as its data input does (or at least after a small propagation delay), provided the latch is enabled via an enable input. A flip-flop is synchronous and edge-triggered and only changes state when a clocking control signal goes from high to low or low to high. Thus, a conventional D flip-flop, e.g., one implemented in CMOS, has two binary inputs, a data input D and a clock input, and at least one output, Q. The D flip-flop captures the value of the D input at a definite portion of an input clock cycle, e.g., a rising edge or a falling edge, known as the capture time. That captured value becomes the Q output. The output Q does not change except at the capture time (or some small propagation delay thereafter). In practical implementations it is required that a data input D be stable for some setup time prior to the capture time and for some hold time after the capture time for the input to be reliably captured and propagated to the output. A conventional D latch, with an enable input rather than a clock input, behaves similarly, except that the output can change according to the data input so long as an enable input remains asserted.

In the context of superconducting reciprocal quantum logic (RQL) circuits, phase-mode logic (PML) allows digital values to be encoded as superconducting phases of one or more Josephson junctions. For example, a logical "1" may be encoded as a high phase and a logical "0" may be encoded as a low phase. For example, the phases may be encoded as being zero radians (meaning, e.g., logical "0") or $2\pi$ radians (meaning, e.g., logical "1"). These values persist across RQL AC clock cycles in PML because there is no requirement for a reciprocal pulse to reset the Josephson junctions phase. In contrast to PML, in wave-pipelined logic (WPL), a logical "1" is encoded as a positive single flux quantum (SFQ) pulse followed by a reciprocal negative pulse, whereas a logical "0" is encoded as the absence of either such pulse.

SUMMARY

One example includes a reciprocal quantum logic (RQL) non-destructive readout (NDRO) gate that includes a body circuit and one or more tail circuits connected to the body circuit. The body circuit has at least one single flux quantum (SFQ) logical input. The body circuit is configured to store at least one logical state. Each tail circuit in the NDRO gate includes a tail input inductor connected between an NDRO read-enable input port and the body circuit and configured to receive an SFQ pulse NDRO read-enable signal on the NDRO read-enable input port, a tail Josephson junction connected between the body circuit and a circuit ground, and a tail output inductor connected between the body circuit and an NDRO output port and configured to transmit an SFQ pulse NDRO output signal based on the stored logical state and the NDRO read-enable signal without affecting the stored logical state.

Another example includes an RQL demultiplexer circuit (demux). The demux has respective ports for a selector input, a data input, a first output, and a second output. The demux further has a selector Josephson junction connected between a first node and a circuit ground and configured to trigger upon assertion of a selector input signal from the selector input port. The demux further has first and second circuit branches diverging from the first node and converging at a second node configured to receive the data input at the data input port. The first branch includes an inductor connected between the first node and a second node. The first branch further includes a pulse generator connected to the second node, comprising two Josephson junctions and an AC bias source. The first branch further includes an escape Josephson junction connected between the second node and a third node. The first branch further includes a first output Josephson junction connected between the third node and the circuit ground. The second branch includes an inductor connected between the first node and a fourth node. The second branch further includes a second output Josephson junctions connected between a fifth node and the circuit ground. The second branch further includes a third output Josephson junction connected between the fourth node and the circuit ground. Non-assertion or assertion of the selector signal respectively selects between a signal arriving on the data input port being propagated through the third node to the first output port, or the signal arriving on the data input port being propagated through the fifth and fourth nodes to the second output port.

Yet another example includes an RQL central processing unit (CPU) that includes a register file having an array of RQL non-destructive readout (NDRO) gate circuits. Each NDRO gate circuit includes a body circuit having one of a D latch or a D flip-flop configured to store a logical state. Each body circuit is connected to at least two tail circuits in the NDRO gate circuit and is configured to supply a pre-critical state current to a respective tail Josephson junction in each of the at least two tail circuits. Each pre-critical state current is representative of the same stored logical state. Each tail circuit is configured to propagate to an NDRO output port of the respective tail circuit an output signal corresponding to the logical AND of the stored logical state with a respective NRDO read enable signal provided to an NDRO input port of the respective tail circuit. The propagation of any output signal from any of the tail circuits does not affect the logical state stored in the body circuit connected to said tail circuits. Each body circuit in the register file array of NDRO gate circuits can include a data input port and a logical clock input port. Word lines of the register file can be connected to the logical clock input ports of the body circuits across word-lines of the respective NDRO gate circuits in the array, and bit lines of the register file can be connected to the NDRO inputs of the tail circuits of the NDRO gate circuits in the array. Each NDRO gate circuit in the array can be configured to have its logical state both writable and readable in the same operation cycle.

DETAILED DESCRIPTION

A non-destructive readout (NDRO) circuit topology includes one or more readout "tails" used to propagate, as one or more non-destructive output signals, a state stored in a logical circuit "body" to which the one or more tails are connected. In part because signals used to trigger readout and the output signals corresponding to the stored state can be propagated as single flux quantum (SFQ) pulses, the readout circuit topology is compatible with circuit designs of the reciprocal quantum logic (RQL) family of superconducting logic for ultra-low-power superconducting computing. The examples provided herein expand and improve on RQL technology in many areas of logic and memory circuitry, in terms of reducing device count, improving functionality, and minimizing or eliminating large transformers.

Figure 1:
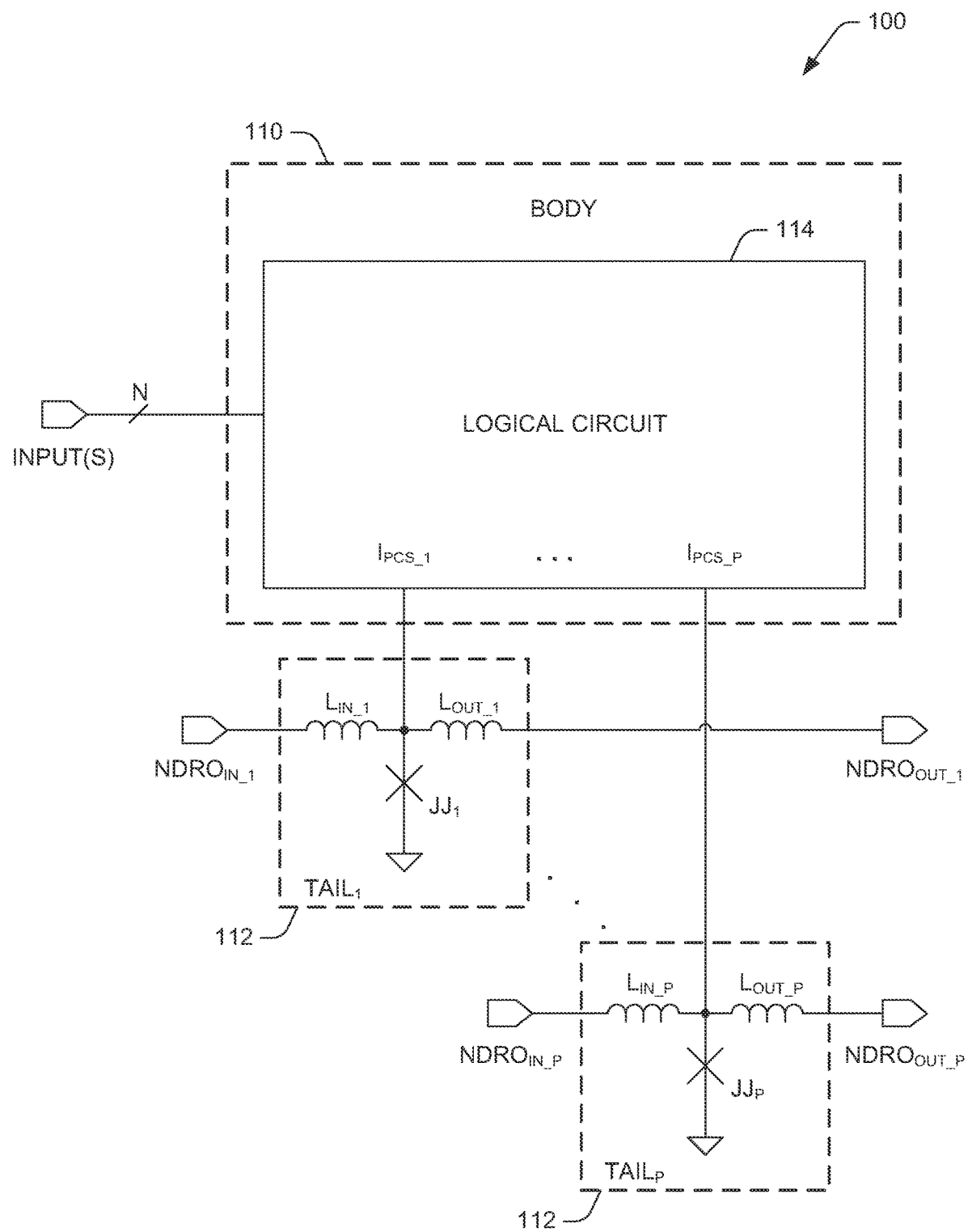
FIG. 1 is a block/circuit diagram of an example reciprocal quantum logic (RQL) is non-destructive readout (NDRO) gate.

FIG. 1 is a block/circuit diagram of an example NDRO gate 100, which includes body 110 and one or more tails 112. The logical circuit 114 in the body provides a single or multi-state sub-critical bias current to an integer number P of independent circuitries 112, one or more, each referred to herein as a tail. Logical circuit 114 of the body 110 has an integer number N of input(s), one or more, upon which any type of logic operation or logical gate functionality can be performed by logical circuit 114 in order to produce one or more outputs each stored as an internal state of body 110. Thus, body 110 can have one or many (i.e., P) internal states that can produce a combination of independent pre-critical state bias currents ($I_{PCS\_1}$ through $I_{PCS\_P}$) supplied to one or many (i.e., P) tails 112. All inputs and pre-critical state currents can be encoded either in wave-pipelined or phase-mode logic. The states can be non-transitory inasmuch as they can persist in the body until changed by inputs to the body. The body outputs to the tail(s) are not considered as inputs to the body since the gate 100 is an NDRO readout gate.

In FIG. 1, first tail $TAIL_1$ is provided a first pre-critical state current $I_{PCS\_1}$ from logical circuit 114, while Pth tail $TAIL_P$ is provided a Pth pre-critical state current $I_{PCS\_P}$ from logical circuit 114. Each tail is also provided a non-destructive readout enable signal $NDRO_{IN\_1}$ through $NDRO_{IN\_P}$, respectively, and outputs a read output signal $NDRO_{OUT\_1}$ through $NDRO_{OUT\_P}$, respectively, these output signals corresponding to the state of logical circuit 114.

Each tail 112 can consist of as few as three components. Specifically, each tail 112 can consist of as little as just one Josephson junction (e.g., $JJ_1$, $JJ_P$) having an input end and a grounded end, an input inductor (e.g., $L_{IN\_1}$, $L_{IN\_P}$) connected to the input end of the Josephson junction through which the input non-destructive readout enable signal (e.g., $NDRO_{IN\_1}$, $NDRO_{IN\_P}$) is supplied, and an output inductor (e.g., $L_{OUT\_1}$, $L_{OUT\_P}$) connected to the input end of the Josephson junction through which an output non-destructive readout signal (e.g., $NDRO_{OUT\_1}$, $NDRO_{OUT\_P}$) is supplied to other circuitry (not shown). Josephson transmission lines (JTLs) (not shown in FIG. 1) can be connected to the NDRO input and output of each tail 112 to carry SFQ pulses to and from the tails.

Thus, in an example, logical circuit 114 can provide the functionality of a simple memory storage element such as a flip-flop or latch, effectively storing one bit of data. In other examples, logical circuit 114 can be a logical gate or any combination of logical gates, including AND, OR, XOR, and NOT (i.e., inverter) gates, multiplexers, demultiplexers, and shift registers. The pre-critical state currents $I_{PCS\_1}$ through $I_{PCS\_P}$ can represent a multiplicity of states or, in some examples, they can all represent a single state. In any case, logical circuit 114 supplies its logical state(s) to be output to the one or more tails 112. Each tail 112 has minimal effect on the body, thereby preventing any interference or destruction to the state of the body circuitry 114.

NDRO gate 100 thus uses a state-produced pre-critical bias current from body logical circuitry 114 to pre-critically bias a Josephson junction, $JJ_1$ through $JJ_P$, in the circuitry of each tail 112, allowing each tail 112 to act as an output enabler, in other words, effectively providing a logical AND between the state of the body logical circuitry 114 and a corresponding non-destructive readout enable signal, $NDRO_{IN\_1}$ through $NDRO_{IN\_P}$. This NDRO input of any tail 112 reads and outputs the internal state inside the body 110 without disrupting the internal state inside the body 110. The body 110 can be combinational logic in nature or not at all, and thus, can have one or multiple inputs and one or multiple outputs to its associated tails 112.

Figure 2:
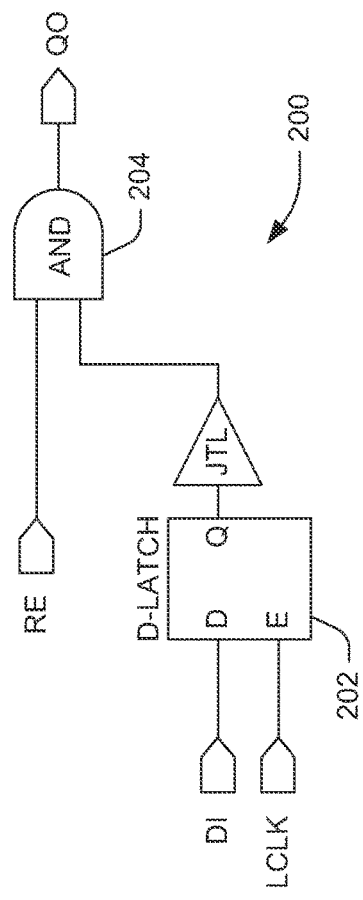
FIG. 2 is a logical block diagram for an example RQL single-read NDRO register.

FIGS. 2-5 illustrate logical diagrams for registers 200, 400 and corresponding superconducting register circuits 300, 500 that do not use the body-tail architecture of FIG. 1 but instead build registers with D-latch and AND-gate stages. FIG. 2 shows a logical block diagram for an example RQL single-read NDRO register 200 that is implemented by combining circuitry for a D latch 202 with circuitry for an AND gate 204. A data input signal DI provided to the data input D of D latch 202 is stored as an output state Q upon being "latched" by an assertion of logical clock signal LCLK provided to enable input E of D latch 202. This signal is logically ANDed with a read enable signal RE by AND gate 204, the output of which is the read output signal QO. An intermediary Josephson transmission line (JTL) can be provided between D latch 202 and AND gate 204, and/or between AND gate 204 and a circuit (not shown) that receives output signal QO, for signal amplification, signal distance transmission, and signal isolation purposes.

Figure 3:
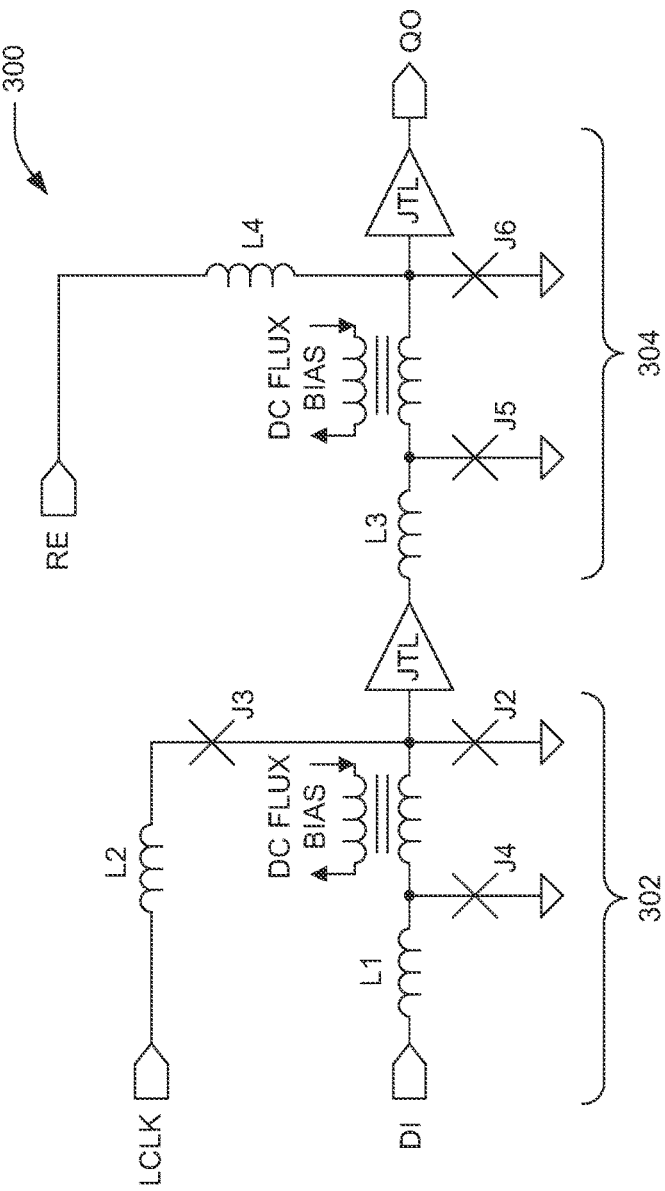
FIG. 3 is a circuit diagram of an example RQL single-read NDRO register.

FIG. 3 shows a circuit diagram implementing the single-read register 200 of FIG. 2 as an example RQL-compatible superconducting circuit 300. An input stage 302 of circuit 300 includes two input ports DI and LCLK, three Josephson junctions J2, J3, and J4, two input inductors L1 and L2, and a first transformer for inductively coupling a DC flux bias from a DC flux bias line. Input stage 302 corresponds to, and provides the functionality of, D latch 202 from FIG. 2. An output stage 304 of circuit 300 includes an input port RE, an output port QO, two inductors L3, L4, two Josephson junctions J5, J6, and a second transformer for inductively coupling a DC flux bias from a DC flux bias line. Output stage 304 corresponds to, and provides the functionality of, AND gate 204 from FIG. 2. An intermediary JTL can be provided between input stage 302 and output stage 304, and/or between output stage 304 and a circuit (not shown) that receives output signal QO, for signal amplification, signal distance transmission, and signal isolation purposes.

Figure 4:
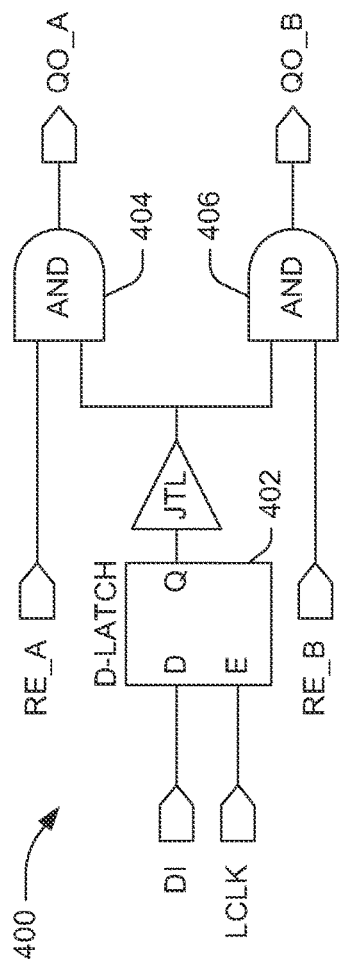
FIG. 4 is a logical block diagram for an example RQL dual-read NDRO register.

FIG. 4 shows a logical block diagram for an example dual-read register 400 that is implemented by combining circuitry for a D latch 402 with circuitry for two AND gates 404, 406. As shown in logical diagram 400, the output of the D latch 402 is forked between the two AND gates 404, 406. The functioning of D-latch 402 and each AND gate 404, 406 is the same as has been described above with respect to FIG. 2. A data input signal DI provided to the data input D of D latch 402 is stored as an output state Q upon being "latched" by an assertion of logical clock signal LCLK provided to enable input E of D latch 402. This output signal is logically ANDed with each of two read enable signals RE_A and RE_B by AND gates 404, 406, respectively, the outputs of which are the read output signals QO_A and QO_B. As discussed above, intermediary JTLs can be provided between D latch 402 and AND gates 404, 406 and/or between AND gates 404, 406 and circuits (not shown) that receive output signals QO_A and QO_B, for signal amplification, signal distance transmission, and signal isolation purposes.

Figure 5:
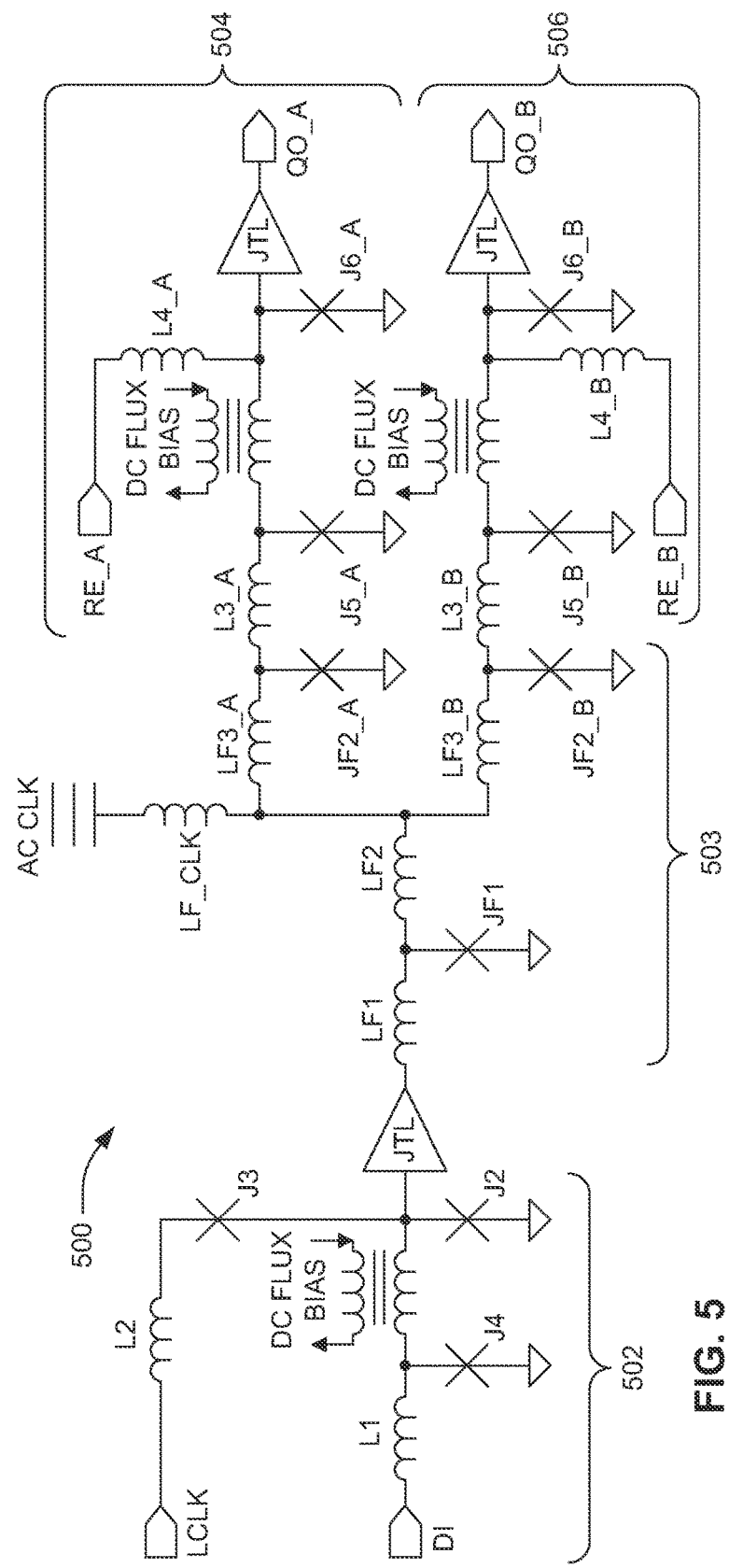
FIG. 5 is a circuit diagram of an example RQL dual-read NDRO register.

FIG. 5 shows a circuit diagram implementing the dual-read register 400 of FIG. 4 as an example RQL-compatible superconducting circuit 500. Input stage 502 of circuit 500 includes two input ports DI and LCLK, three Josephson junctions J2, J3, and J4, two input inductors L1 and L2, and a first transformer for inductively coupling a DC flux bias from a DC flux bias line. Input stage 502 corresponds to, and provides the functionality of, D latch 402 from FIG. 4. First output stage 504 of circuit 500 includes an input port RE_A, an output port QO_A, two inductors L3_A, L4_A, two Josephson junctions J5_A, J6_A, and a second transformer for inductively coupling a DC flux bias from a DC flux bias line. First output stage 504 corresponds to, and provides the functionality of, AND gate 404 from FIG. 4. Second output stage 506 of circuit 500 includes an input port RE_B, an output port QO_B, two inductors L3_B, L4_B, two Josephson junctions J5_B, J6_B, and a third transformer for inductively coupling a DC flux bias from a DC flux bias line. Second output stage 506 corresponds to, and provides the functionality of, AND gate 406 from FIG. 4.

Between input stage 502 and output stages 504, 506, fork stage 503 can provide an output signal from input stage 502 as input signals to each of output stages 504, 506. Fork stage 503 includes three Josephson junctions JF1, JF2_A, and JF2_B, four inductors LF1, LF2, LF3_A, and LF3_B, and a fifth inductor LF_CLK to an AC bias signal source AC CLK. Intermediary JTLs can be provided between input stage 502 and fork stage 503, and/or between output stages 504, 506 and circuits (not shown) that receive output signals QO_A, QO_B, for signal amplification, signal distance transmission, and signal isolation purposes.

Circuits 300 and 500, as logically symbolized in diagrams 200 and 400, respectively, each connect a D-latch output to one or more AND gates via JTL(s) depending on the number of read ports desired. Despite their superficial simplicity, device count and resource utilization is relatively high in these designs. In addition to this, the illustrated configurations lack the functionality of being able to read and write at the same time, which is a desirable performance feature for a register file to have in the realm of CPU architecture.

Dual-read register circuit 500 of FIG. 5 is relatively complicated, has a high part count (having 24 components not including those in JTLs, ports, and AC bias source), and relatively high resource utilization (e.g., requiring three DC flux bias line connections as well as AC bias source connections to power the JTLs and fork stage 503). However, in view of the purpose of circuit 500 as implementing the logical functionality illustrated in block diagram 400 of FIG. 4, it may not be apparent how circuit 500 might be simplified given that and each of its stages 502, 503, 504, 506 implements a logical component or signal split from diagram 400. Additionally, the need for signal propagation (from left to right in the circuits as illustrated) means that circuits 300 and 500 do not permit writing a data input signal and reading that same data input signal at substantially the same time (e.g., within the same operation cycle). The examples of FIGS. 6-9 reconceptualize the logical designs and implementations of FIGS. 2-5, reducing part count while providing improved functionality, e.g., by permitting simultaneous writing of a state and reading of the written state. In view of these examples, it is clear that even single-read register circuit 300 of FIG. 3 is unduly complicated and has a higher part count than desirable.

Figure 6:
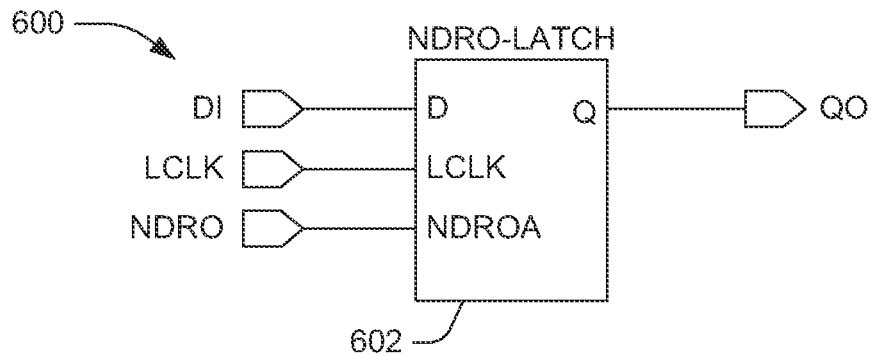
FIG. 6 is a logical block diagram for an example RQL single-read NDRO register.

FIG. 6 shows a logical block diagram for an example single-read RQL D-register 600 that has at least all of the functionality of single-read register 200 from FIG. 2 but is capable of providing non-destructive readout without the D-latch-to-AND-gate staging shown in FIGS. 2 and 3. A data input signal DI provided to the data input D of NDRO-latch 602 is stored as an internal state of NDRO-latch 602 upon being "latched" by an assertion of logical clock signal LCLK provided to the same-named input of NDRO-latch 602. Upon assertion of a non-destructive readout signal NDRO, provided to input NDROA of NDRO-latch 602, which can be substantially contemporaneous with (e.g., within the same operation cycle as) the logical clock signal assertion, the internal state is read out from output Q as read output signal QO.

Figure 7:
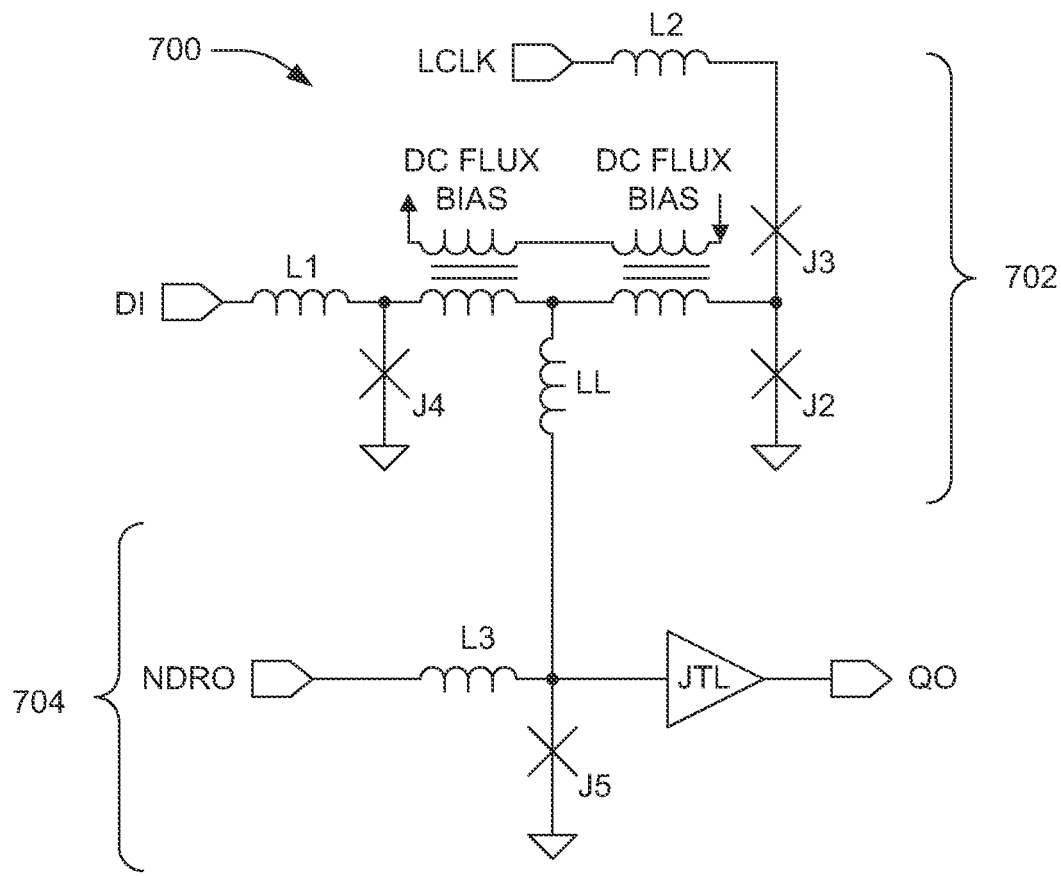
FIG. 7 is a circuit diagram of an example RQL single-read NDRO register having a body-tail topology.

FIG. 7 shows a circuit diagram implementing the single-read RQL D-register 600 of FIG. 6 as an example RQL-compatible superconducting circuit 700. Body stage 702 of circuit 700 includes two input ports DI and LCLK, three Josephson junctions J2, J3, and J4, two input inductors L1 and L2, and transformer(s) for inductively coupling a DC flux bias from a DC flux bias line. At circuit initialization, the DC flux bias transformers bias Josephson junction J2 with a fraction of a $\Phi_0$ offset (e.g., ½ $\Phi_0$). ($\Phi_0$ is a single flux quantum, equal to approximately 2.07 mA-pH.) Body stage 702 can correspond to body 110 in FIG. 1. Tail stage 704 of circuit 700 includes an input port NDRO, an output port QO, one inductor L3, and one Josephson junction J5. Tail stage 704 can correspond to a tail 112 in FIG. 1. Body stage 702 can be connected to tail stage 704 by a linking inductor LL. A more detailed description of the functioning of the single-read register circuit 700 of FIG. 7 follows with reference to the simulation timing diagram 1000 of FIG. 10.

Tail stage 704 does not have two Josephson junctions, nor does it have a second transformer for inductively coupling a DC flux bias from a DC flux bias line, as may be found in the output stage 304 of FIG. 3. Circuit 700 also does not include an intermediary JTL between body stage 702 and tail stage 704, although a JTL may, as illustrated in FIG. 7, be provided between tail stage 704 and a circuit (not shown) that receives output signal QO, for signal amplification, signal distance transmission, and signal isolation purposes.

Figure 8:
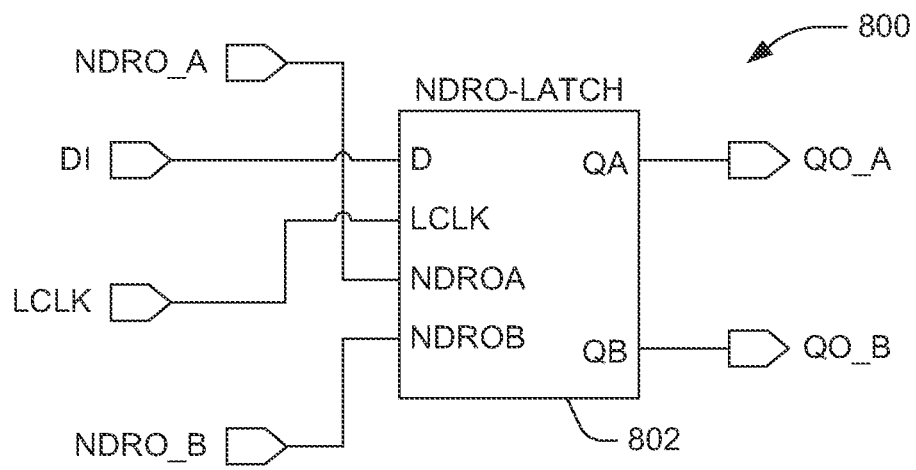
FIG. 8 is a logical block diagram for an example RQL dual-read NDRO register.

FIG. 8 shows a logical block diagram for an example dual-read RQL D-register 800 that has at least all of the functionality of dual-read register 400 from FIG. 4 but is capable of providing non-destructive readout without the D-latch-to-AND-gate staging shown in FIGS. 4 and 5. A data input signal DI provided to the data input D of NDRO-latch 802 is stored as an internal state of NDRO-latch 802 upon being "latched" by an assertion of logical clock signal LCLK provided to the same-named input of NDRO-latch 802. Upon assertion of a first non-destructive readout signal NDRO_A, provided to input NDROA of NDRO-latch 802, which can be substantially contemporaneous with (e.g., within the same operation cycle as) the logical clock signal assertion, the internal state is read out from output QA as read output signal QO_A. Upon assertion of a second non-destructive readout signal NDRO_B, provided to input NDROB of NDRO-latch 802, which can be substantially contemporaneous with (e.g., within the same operation cycle as) the logical clock signal assertion, the internal state is read out from output QB as read output signal QO_B.

Figure 9:
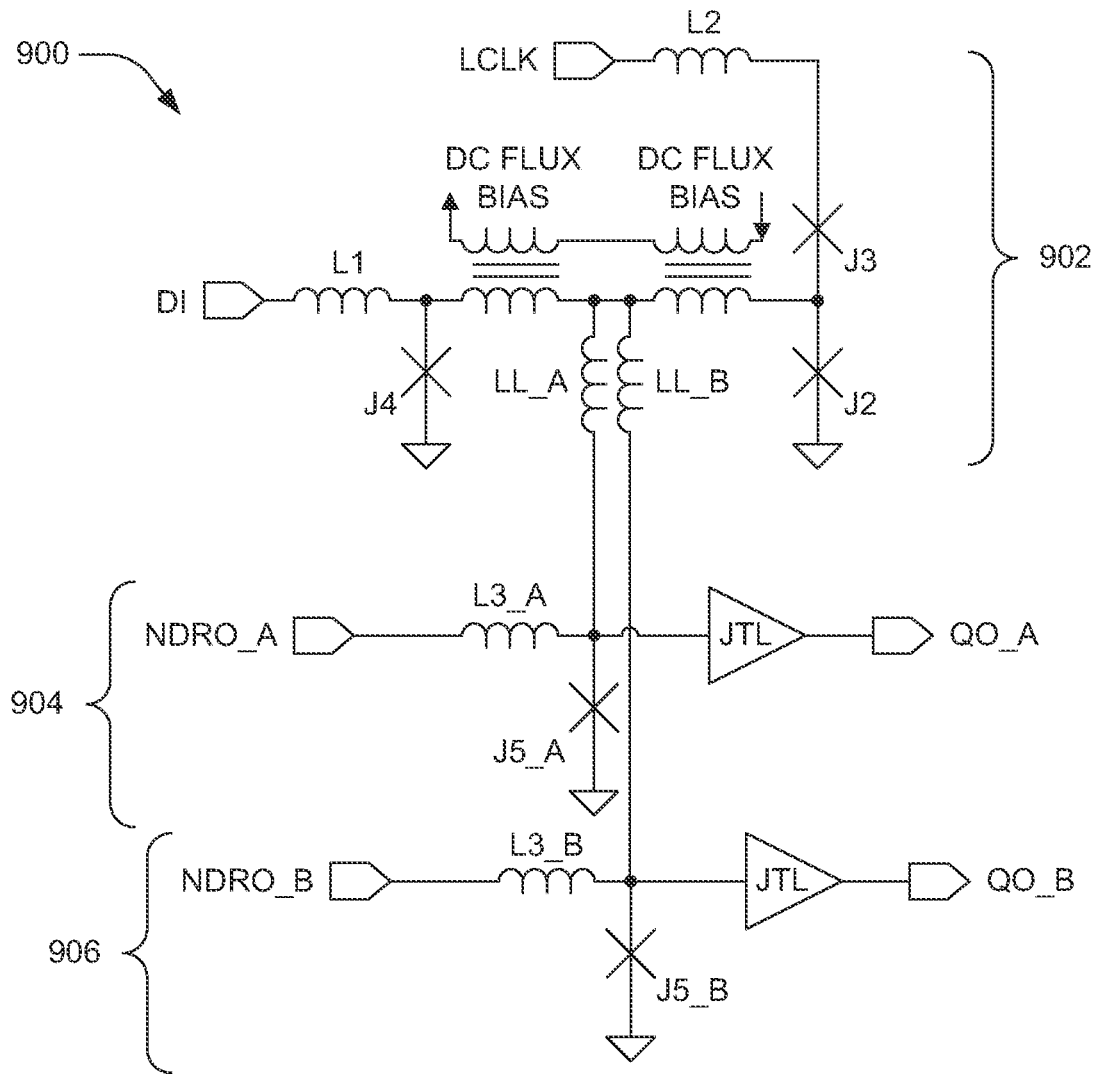
FIG. 9 is a circuit diagram of an example RQL dual-read NDRO register having a body-tail topology.

FIG. 9 shows a circuit diagram implementing the dual-read RQL D-register 800 of FIG. 8 as an example RQL-compatible superconducting circuit 900. Body stage 902 of circuit 900 includes two input ports DI and LCLK, three Josephson junctions J2, J3, and J4, two input inductors L1 and L2, and transformer(s) for inductively coupling a DC flux bias from a DC flux bias line. Body stage 902 can correspond to body 110 in FIG. 1. First and second tail stages 904, 906 of circuit 900 include respective input ports NDRO_A, NDRO_B, respective output ports QO_A, QO_B, respective inductors L3_A, L3_B, and respective Josephson junctions J5_A, J5_B. Tail stages 904, 906 can correspond to tails 112 in FIG. 1. Body stage 902 can be connected to tail stages 904, 906 by a linking inductors LL_A, LL_B.

The functioning of the body stage 902 and tail stages 904, 906 in circuit 900 of FIG. 9 is substantially the same as the functioning of body stage 702 and tail stage 704 in circuit 700 of FIG. 7, except that, since in the particular example of circuit 900 both tail stages 904, 906 are connected to the same "output" of body stage 902 and thus receive the same stored state from body stage 902, the output current from body stage 902 is required to be large enough to drive two tails instead of one. Consequently, the sizes of the Josephson junction devices in body stage 902 may be larger as compared to those in body stage 702 of circuit 700.

In circuit 900, tail stages 904, 906 do not have two Josephson junctions each, nor do they each have a second transformer for inductively coupling a DC flux bias from a DC flux bias line, as may be found in the output stages 504, 506 of FIG. 5. Circuit 900 also does not include intermediary JTLs between body stage 902 and tail stages 904, 906, although JTLs may, as illustrated in FIG. 9, be provided between tail stages 904, 906 and respective circuits (not shown) that receive output signals QO_A, QO_B, these JTLs being for the purposes of signal amplification, signal distance transmission, and signal isolation.

Summarizing the component-economy structural advantages of body/tail circuits 700 and 900 over D-latch/AND-gate circuits 300 and 500, respectively, single-read body/tail circuit 700 uses four Josephson junctions and one JTL whereas single-read D-latch/AND-gate circuit 300 uses five Josephson junctions and two JTLs, for a savings of one Josephson junction and one JTL (which itself includes one or more Josephson junctions); dual-read body/tail circuit 900 uses five Josephson junctions and two JTLs as compared to the ten Josephson junctions and three JTLs used in D-latch/AND-gate dual-read circuit 500, for a savings of five Josephson junctions and one JTL. Furthermore, dual-read body/tail circuit 900 has fewer inductors and fewer inductive couplings than dual-read D-latch/AND-gate circuit 500. Since a reduction in number of Josephson junctions and inductors leads to a higher count of memory cells or logic cells per fabricated die area or chip area, example body/tail circuits 700 and 900 reduce cost by greatly increasing density of a memory array or logic array.

Figure 10:
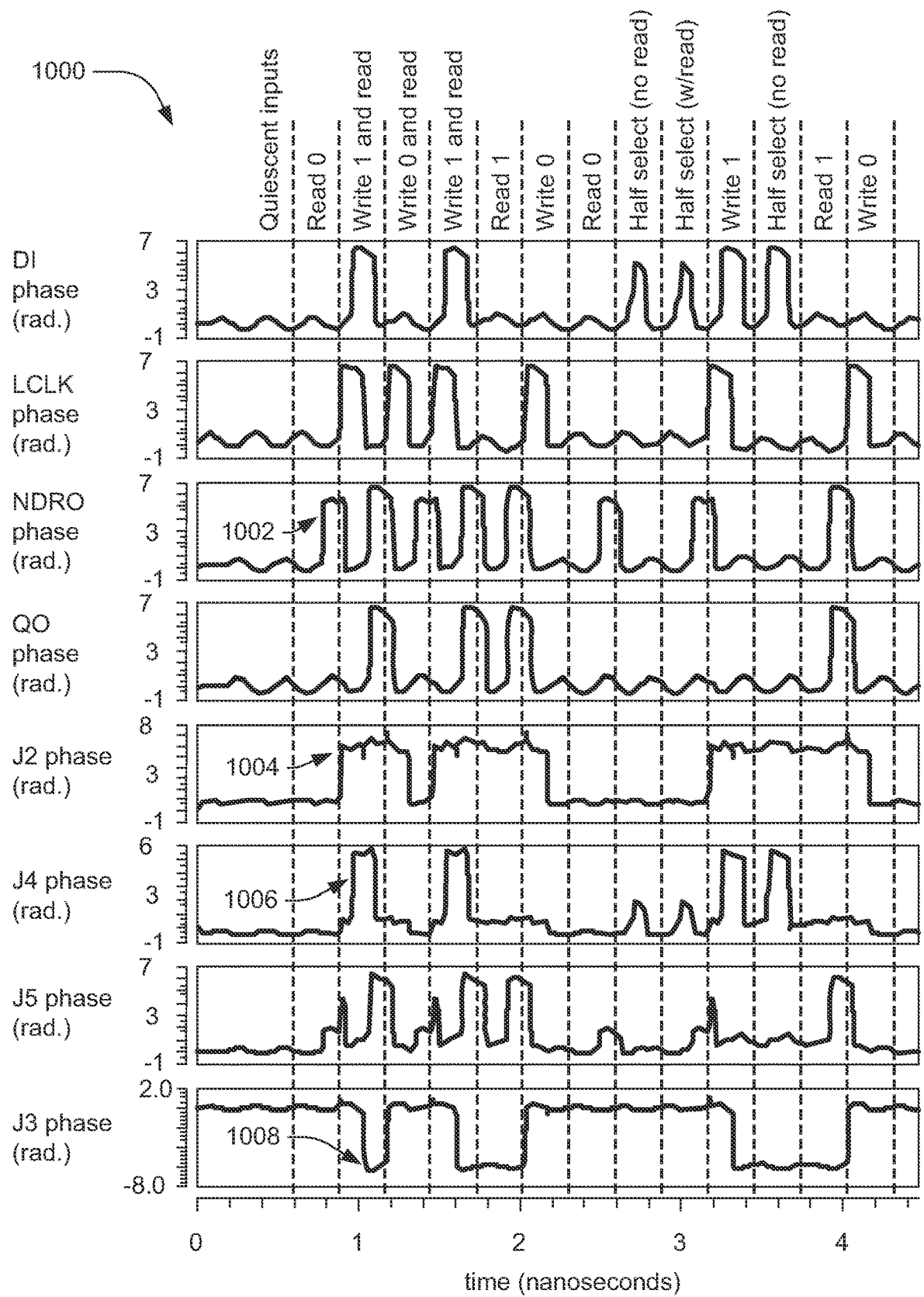
FIG. 10 a timing diagram for the RQL single-read NDRO register circuit of FIG. 7.

FIG. 10 presents a timing diagram 1000 illustrating the functioning of the RQL single-read NDRO register circuit 700 of FIG. 7. Each of seven plots in diagram 1000 is presented as a function of time in nanoseconds. The DI signal plot represents a data input provided to the circuit to set a circuit state, e.g., a memory or logic state. The LCLK signal plot represents a logical clock input that acts as a write enable signal. The NDRO signal plot represents a non-destructive readout input that acts as a read enable signal. The QO signal plot represents a non-destructive readout output that can be provided as an input signal to another circuit. Also included to assist in understanding the functioning of circuit 700 are the superconducting phases of Josephson junctions J2, J4, J5, and J3, where phase is defined as the time-integral of voltage at every node. Text legends along the top of the timing diagram specify the circuit operation invoked, i.e., the underlying meaning of the particular combination of inputs and output, according to the following truth table, where "previous state" is indicated by the phase of Josephson junction J2 during the end of the previous operation cycle:

|  | DI | LCLK | NDRO | Previous state | New state | QO |
|---|---|---|---|---|---|---|
| No inputs | 0 | 0 | 0 | 0 or 1 | Prev. | 0 |
| Read 0 | 0 | 0 | 1 | 0 | 0 | 0 |
| Read 1 | 0 | 0 | 1 | 1 | 1 | 1 |
| Write 0 | 0 | 1 | 0 | 0 or 1 | 0 | 0 |
| Write 0 and read | 0 | 1 | 1 | 0 or 1 | 0 | 0 |
| Half select (no read) | 1 | 0 | 0 | 0 or 1 | Prev. | 0 |
| Half-select (with read 0) | 1 | 0 | 1 | 0 | 0 | 0 |
| Half-select (with read 1) | 1 | 0 | 1 | 1 | 1 | 1 |
| Write 1 | 1 | 1 | 0 | 0 or 1 | 1 | 0 |
| Write 1 and read | 1 | 1 | 1 | 0 or 1 | 1 | 1 |

For each operation cycle, NDRO (i.e., read enable) input signals are timed to come after a set-up and hold time from the beginning of any LCLK (i.e., write enable), such that a data value written to the body stage 702 can be read out from the tail stage 704 within the same operation cycle. This timing can be enforced by support circuitry outside of circuit 700 and can employ, for example, JTLs configured to provide various signal time delays. A "half-select" condition is defined as an application of a logical "high" signal to data input DI without a corresponding logical "high" write enable signal on logical clock input LCLK.

Single-read RQL D-register circuit 700 uses the phase of Joseph junction J2 in body stage 702 to encode a stored state value and to source a stable pre-critical bias current to Josephson junction J5 in tail stage 704. Although this pre-critical bias current is insufficient to cause Josephson junction J5 to trigger, it sufficiently biases Josephson junction J5 such that its triggering is directly correlated to the value of the non-destructive readout input signal NDRO. Specifically, a positive NDRO pulse will trigger Josephson junction J5 and thereby send out an SFQ pulse to output QO, and a negative NDRO pulse will reset Josephson junction J5. The bias from input NDRO can be made weak, and isolation between the tail stage 704 to the body stage 702 (i.e., in the tail-to-body direction) can be sufficiently high to avoid any corruption of the body-stored state by NDRO signals, which is what makes the readout "non-destructive."

In single-read RQL D-register circuit 700, Josephson junction J2 junction triggers when the logical lock input LCLK goes "high" (i.e., when a positive SFQ pulse is provided on the logical clock input LCLK to assert the logical clock input), bringing the superconducting phase of Josephson junction J2 to $2\pi$ radians ("high"). The phase of Josephson junction J2 remains "high" if the data input DI is asserted (i.e., with a positive SFQ pulse introduced to data input DI) upon the falling edge of the logical clock signal provided on input LCLK. Josephson junction J2 will "flip back" (i.e., its phase will return to 0 radians, "low") if data input DI is unasserted ("low") during this time. Consequently, the superconducting phase of Josephson junction J2 determines the internal state of the body 702 of RQL D-register circuit 700. Thus, for example, Josephson junction J2 having a $2\pi$ radian superconducting phase can correspond to a stored "1" (logical "high") value, whereas Josephson junction J2 having a 0 radian superconducting phase can correspond to a stored "0" (logical "low"). In particular, the stored state corresponds to the phase of state-storing Josephson junction J2 during the latter half of an operation cycle, as can be noted in timing diagram 1000, particularly during "write 0" operations.

A stored "1" from a triggered Josephson junction J2 in body 702 provides a pre-critical bias current to Josephson junction J5 in tail 704. Under this biased condition, tail Josephson junction J5 does not trigger unless the read-enabling input NDRO is asserted (goes "high"), which then passes the body-stored state to output QO. The triggering of Josephson junction J5 does not affect the internal state of the body 702 (encoded as the superconducting phase of Josephson junction J2), giving the readout of circuit 700 its non-destructive property.

Because tail Josephson junction J5 can only trigger when body-state storage Josephson junction J2 has triggered to bring it into its $2\pi$ radian superconducting phase and the non-destructive readout input NDRO is asserted with a positive SFQ pulse, the NDRO input and corresponding output QO can be either wave-pipelined logic (WPL) or phase-mode logic (PML) encoded, and the assertion of the non-destructive readout input NDRO must arrive after Josephson junction J2 has been properly setup or logical clock signal provided on input LCLK is de-asserted. With proper phase timing of the logical lock and non-destructive readout signals provided on inputs LCLK and NDRO, data can be written and read during the same clock cycle, speeding memory and computing operations.

The various operational states of circuit 700 will now be explored with reference to the simulation timing diagram 1000 of FIG. 10, reading its operation cycles (separated by vertical broken lines) in chronological order from left to right.

"Quiescent inputs": The circuit 700 begins with no state value stored in its body 702. When all three inputs DI, LCLK, and NDRO are unasserted, the circuit is in a "quiescent inputs" operational state, and output QO is therefore "low."

"Read 0": The next operation cycle is a read cycle, in which an NDRO pulse 1002 introduced in the latter half of the cycle "reads out" the body-stored state, which is still "low," since no write operation has changed it from its initial value. Thus, output QO remains "low."

"Write 1 and read": The next cycle sees all three inputs DI, LCLK, and NDRO asserted to write a logical "high" value as the body-stored state and enable the reading out of this state to output QO all within the same operation cycle. The superconducting phase of Josephson junction J2 goes "high" (e.g., to $2\pi$ radians) 1004 as soon as the write-enabling signal provided on logical clock input LCLK goes "high." It stays high after an assertion SFQ pulse supplied to the data input DI triggers 1006 Josephson junction J4. When LCLK transitions low, the "high" superconducting phase of state-storing Josephson junction J2 is maintained. Instead of Josephson junction J2 untriggering, escape Josephson junction J3 triggers 1008. The combination of the logical clock input LCLK going "high" and data input DI going "high" puts circuit 700 into a "write 1" state, causing a "1" to be written to the body-stored state by maintaining Josephson junction J2 in a $2\pi$ radian superconducting phase. The phase of Josephson junction J2 goes "high," even before the data input DI goes "high," but without data input DI being asserted, Josephson junction J2 would return "low" after the write enable signal LCLK goes "low" (as can be seen at the "Write 0" operation, discussed below). As long as Josephson junction J2 is in a "high" state of $2\pi$ radians, it provides pre-critical bias current to tail Josephson junction J5, preparing tail Josephson junction J5 to propagate any pulse it receives at input NDRO to output QO.

The written state is read out on output QO immediately, within the same operation cycle. The NDRO command is timed later in the operation cycle than the LCLK command, because any time the write enable signal of logical clock input LCLK goes high, Josephson junction J2 is asserted to a "high" superconducting phase, meaning that a premature read-out attempt will result in a readout value of "1" regardless of whether a "1" or a "0" is being written. Because the read enable signal NDRO is delayed in time, the read-out state will, appropriately, be the same state that is written earlier in the same operation cycle.

The superconducting phase of Josephson junction J5 signifies the readout of a "1," and can be interpreted as a logical AND of the superconducting phase of Josephson junction J2 and the read-enabling NDRO command. Thus, sending input NDRO "high" when Josephson junction J2 is in a $2\pi$ radian superconducting phase ("high") causes the superconducting phase of Josephson junction J5 to transition to $2\pi$ radians ("high") and propagates an SFQ pulse toward output QO. (Accordingly, the plot for output QO finally falls to "low" when the plot for the phase of Josephson junction J5 also falls to "low.") An attempt to perform a readout when the superconducting phase of Josephson junction J2 is 0 radians is not sufficient to trigger Josephson junction J5, so the output QO reads "0." Once again emphasizing the non-destructive readout operation of circuit 700, a triggering of Josephson junction J5 does not affect the phase of Josephson junction J2 (or any of the other Josephson junctions in circuit 700) and thus does not change the body-stored logical circuit state (i.e., the memory element state, when circuit 700 is used in a memory).

"Write 0 and read": The write-enabling logical clock signal provided on input LCLK goes "high," but now when the data input DI remains unasserted, the phase of state-storing Josephson junction J2 drops back to 0 radians, as can be seen in the J2 phase plot at the midpoint of the cycle. In the same cycle, a read-enabling command is issued (i.e., input NDRO goes "high"), reading out the written state as "0" on QO, because Josephson junction J5 does not trigger.

2nd "Write 1 and read," followed by "Read 1": These two cycles show the correct non-destructive readout behavior expected from two back-to-back operations. The first readout does not destroy the written "1" state, so when it is followed immediately by another read operation, the same "1" is still read-out again, meaning that the first readout has not corrupted the body-stored state. In the second of these two operations, when the read-enabling signal provided on input NDRO goes "high," the superconducting phase of Josephson junction J2 is already "high," so the superconducting phase of Josephson junction J5, and thus output QO, likewise go "high."

"Write 0": The logical clock signal provided on input LCLK goes "high" to activate the write enable while data input DI is "low." There being no read operation enabled, the output QO is appropriately "low" at the end of the operation cycle. The superconducting phase of state-storing Josephson junction J2 goes "low," indicating that a "0" has been written to the state-storing body 702.

"Read 0": The read-enabling signal provided on input NDRO goes "high,", but not causing the superconducting phase of Josephson junction J2 to go "high," indicating that the "low" stored memory state is preserved, uncorrupted by the read-enabling signal provided on input NDRO. As can be seen later at the beginning of the next "Write 1" operation, even the combination of inputs NDRO and LCLK both going "high" is insufficient to cause Josephson junction J5 to trigger and produce an output at the beginning of an operation cycle.

"Half select without read (0 state)": The "half-select" condition can arise, for example, during the sending of data to a memory array, when the subject circuit is a particular memory element that is not part of the addressed bit-line. In such a case, it may be that, as an artifact of the array architecture, the "1" signal sent on data input DI is delivered in parallel to every bit-line of the memory array. Thus, although data input DI may be "high," write-enabling logical clock input LCLK is "low." Under such a half-select condition, the stored state should not change. This cycle of diagram 1000 illustrates the correct behavior. Even when data input DI is "high," the combination of "high" data input DI and "low" write enable input LCKL are insufficient to trigger state-storing Josephson junction J2 and change its superconducting phase to $2\pi$ radians. Thus, the written state stored in the circuit body 702 remains "low." The phase of escape Josephson junction J3 is likewise unaffected. Read-enabling input NDRO is "low," meaning no read signal is sent, and output QO remains low.

"Half select with read (0 state)": This operation cycle illustrates the combined effect of an asserted data input DI and an asserted read enable input NDRO on the stored state, i.e., the superconducting phase of state-storing Josephson junction J2. Even when the memory state is "0," inputs DI and NDRO going high do not cause Josephson junction J2 to trigger. The superconducting phase of Josephson junction J2 remains at 0 radians. This cycle thus illustrates again the non-destructive readout functionality of circuit 700, even when the circuit is a half-selected cell in a memory or logic array.

"Write 1": Data input DI goes "high" and is write-enabled by an assertion of logical clock input LCLK. State-storing Josephson junction J2 therefore also triggers to transition to a "high" superconducting phase, but output QO remains "low," there being no read-enabling signal NDRO and therefore no readout.

"Half select without read (1 state)": Data input DI is "high," but write enable LCLK is "low," expressing the half-select condition. This combination does not affect the "high" superconducting phase of state-storing Josephson junction J2. Escape Josephson junction J3 retains its "low" superconducting phase. Read enable input NDRO is "low," and output QO remains "low," even though the stored state is "high."

"Read 1": This read cycle proves again that the half-select condition of the previous cycle did nothing to corrupt the stored "high" state. When read enable input NDRO is asserted, output QO is likewise asserted, indicating successful readout of the "1" state written two cycles prior.

"Write 0": Write enable input LCLK is asserted "high" while data input DI is "low," causing the superconducting phase of state-storing Josephson junction J2 to drop to 0 radians. The phase of escape Josephson junction J3, meanwhile, flips back. Thus, at the end of timing diagram 1000, circuit 700 is reset to its starting state.

In timing diagram 1000 of FIG. 10, signals provided to inputs LCLK and NDRO are temporally shifted relative to each other, with the indicated LCLK state in the above description being the state that LCLK goes shortly after the start of the cycle and the indicated NDRO state in the above description being the state that NDRO goes around the time that LCLK goes "low," e.g., shortly after halfway through the cycle. The phase of Josephson junction J4 is substantially in phase with data input DI, while the phase of Josephson junction J5 is substantially in phase with output QO. In the above description, the indicated DI state, and thus also the indicated phase of Josephson junction J4, is the state or phase at the middle of the operation cycle. The indicated QO state, like with the indicated phases of Josephson junctions J2 and J5, is the state or phase at the end of the operation cycle. As an example, the circuit can be designed such that LCKL and NDRO are out of phase with each other, e.g., 180° out of phase with each other, or 225° degrees out of phase with each other, so that a previous-cycle read has no effect on the operation in a current cycle.

Figure 11:
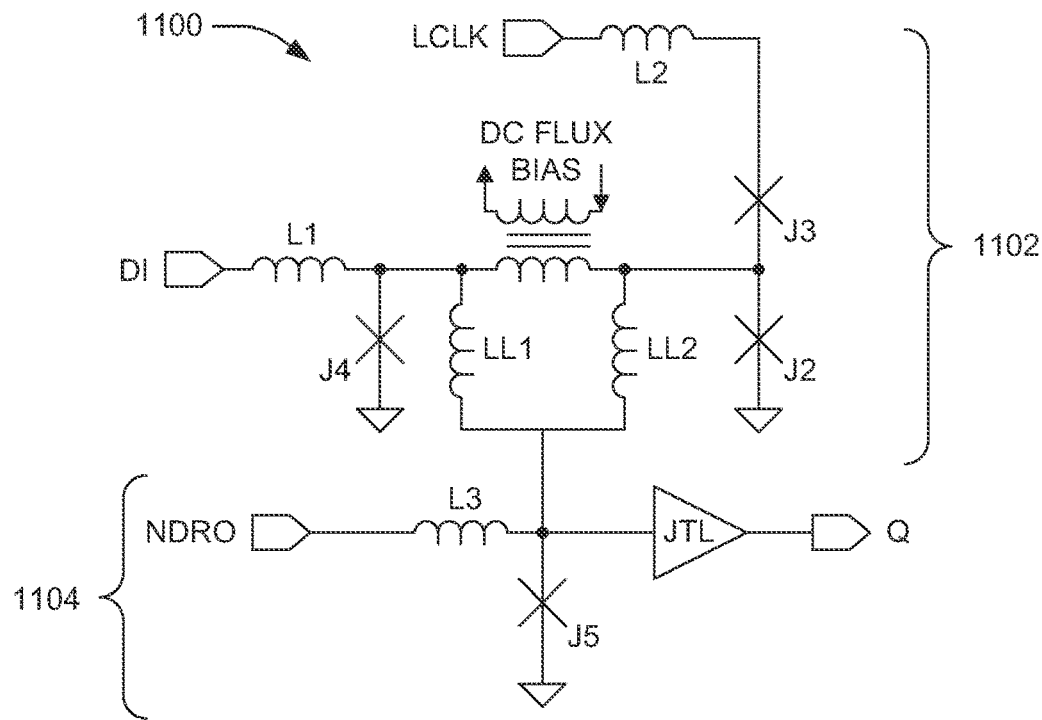
FIG. 11 is a circuit diagram of another example RQL single-read NDRO register having a body-tail topology.
Figure 12:
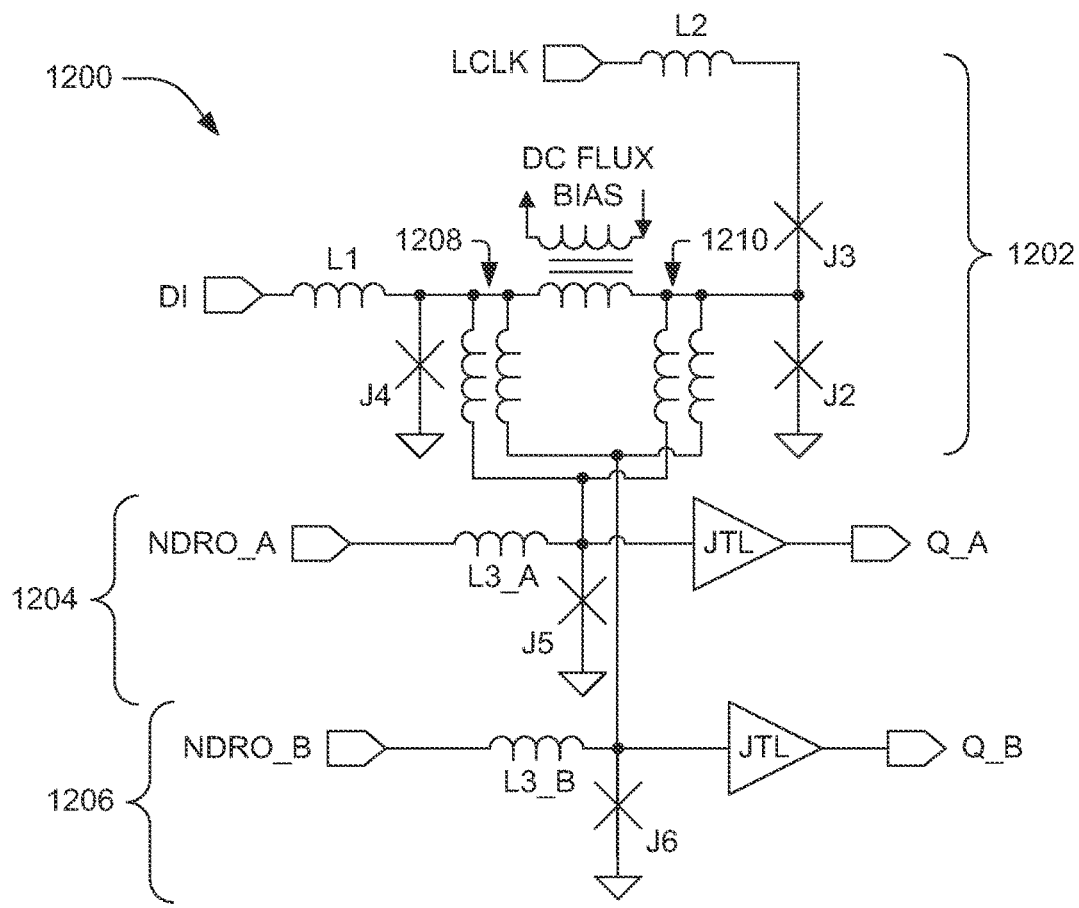
FIG. 12 is a circuit diagram of another example RQL dual-read NDRO register having a body-tail topology.

FIG. 11 shows a circuit diagram implementing the single-read RQL D-register 600 of FIG. 6 as an example RQL-compatible superconducting circuit 1100, similar in form and function to circuit 700 of FIG. 7, but reducing, from two to one, the number of DC flux bias transformers in the circuit by implementing a Y-Δ transform of the central inductance network in the body stage 702 to arrive at body stage 1102, having inductors $LL_1$ and $LL_2$. Tail stage 1104 is unchanged from tail 704. Circuit 1200 of FIG. 12 provides a similar variation of the dual-read RQL D-register 800 of FIG. 8 as compared to circuit 900 of FIG. 9, illustrating that the variation of the latch-based NDRO circuit shown in FIG. 11 can be built to a dual-read or multiple-read configuration by adding on NDRO tail stages 1204, 1206 to nodes 1208, 1210. Tail stages 1204, 1206 are unchanged from tail stages 904, 906; only the topology of body stage 1202 differs from the topology of body stage 902.

Figure 13:
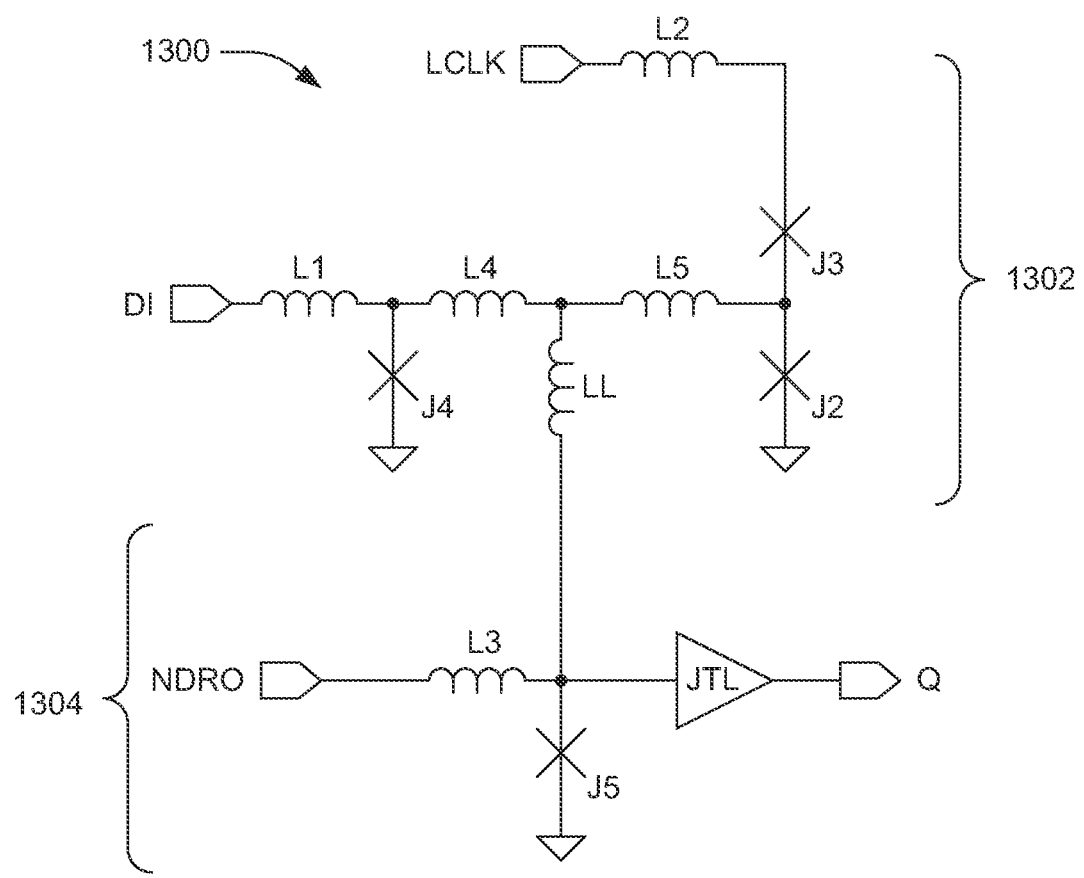
FIG. 13 is a circuit diagram of an example RQL single-read NDRO register, having a body-tail topology, that is flip-flop-based rather than latch-based.

FIG. 13 provides a flip-flop-based NDRO gate 1300 containing the same tail stage 1304 as latch-based NDRO circuit4 700 and nearly the same components in body stage 1302 (as compared to body stage 702) except for inductors L4, L5 substituted for the DC flux bias transformers of circuit 700. Body stage 1302 includes a tri-stable flip-flop. In contrast to the D-latch circuit 700 of FIG. 7, which has two states and a fraction of a $\Phi_0$ (e.g., ½ $\Phi_0$) offset, D flip-flop circuit 1300 has three states and no phase offset. The Josephson junction J2 in circuit 1300 remains the state storage element, but the process of writing is different than with circuit 700. Logical clock input LCLK remains asserted ("high") when not performing a write operation, which prevents a positive pulse from data input DI from triggering Josephson junction J2. To perform a write operation, logical clock input LCLK is de-asserted (goes "low"), allowing Josephson junction J2 to trigger upon assertion of data input DI with a positive SFQ pulse (i.e., DI going "high"). Data input DI remains "high" until logical clock input LCLK is reasserted "high" again, thereby "locking" or storing the data input value as the superconducting phase of Josephson junction J2. Data input DI can then return "low" after logical clock input LCLK goes "high." Readout functionality is unchanged from the latch-based circuit 700, as the two circuits contain same tail stage circuitry.

Variants of the flip-flop-based NDRO circuit 1300 provided in FIG. 13 are contemplated. Although not illustrated, a flip-flop based circuit similar to that of FIG. 13 can be provided having multiple tails, in accordance with the example illustrated in FIG. 9. Although not illustrated, a flip-flop based circuit similar to that of FIG. 13 can be provided having the delta body configuration rather than the Y-topology illustrated in FIG. 13, in view of the delta-configuration circuits illustrated in FIGS. 11 and 12 as compared to their Y-configuration counterparts in FIGS. 7 and 9. Although not illustrated, a flip-flop based circuit similar to that of FIG. 13 can be provided having both the delta body configuration and multiple tails, in accordance with the example illustrated in FIG. 12.

Figure 14:
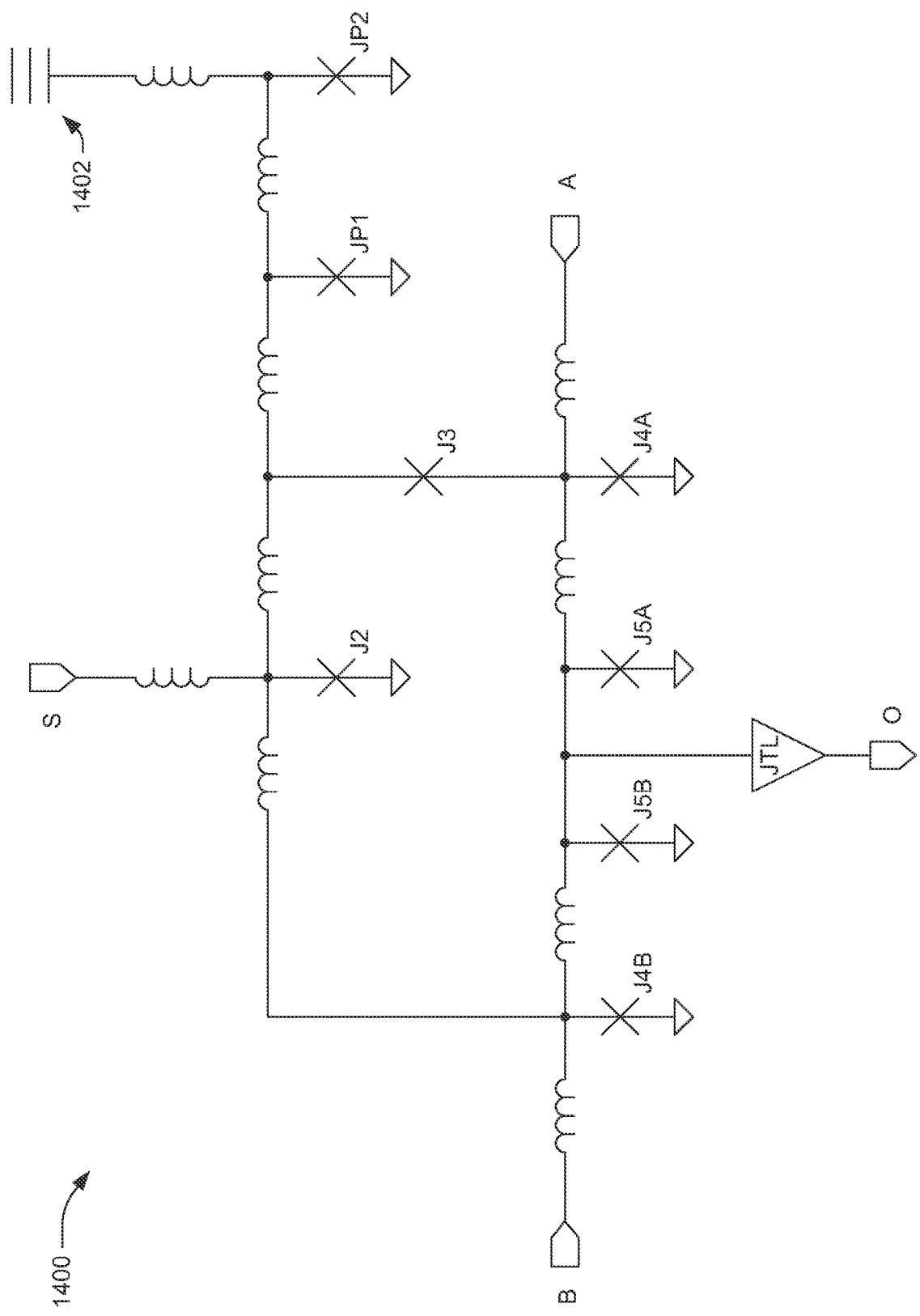
FIG. 14 is a circuit diagram of an example RQL multiplexer.
Figure 15:
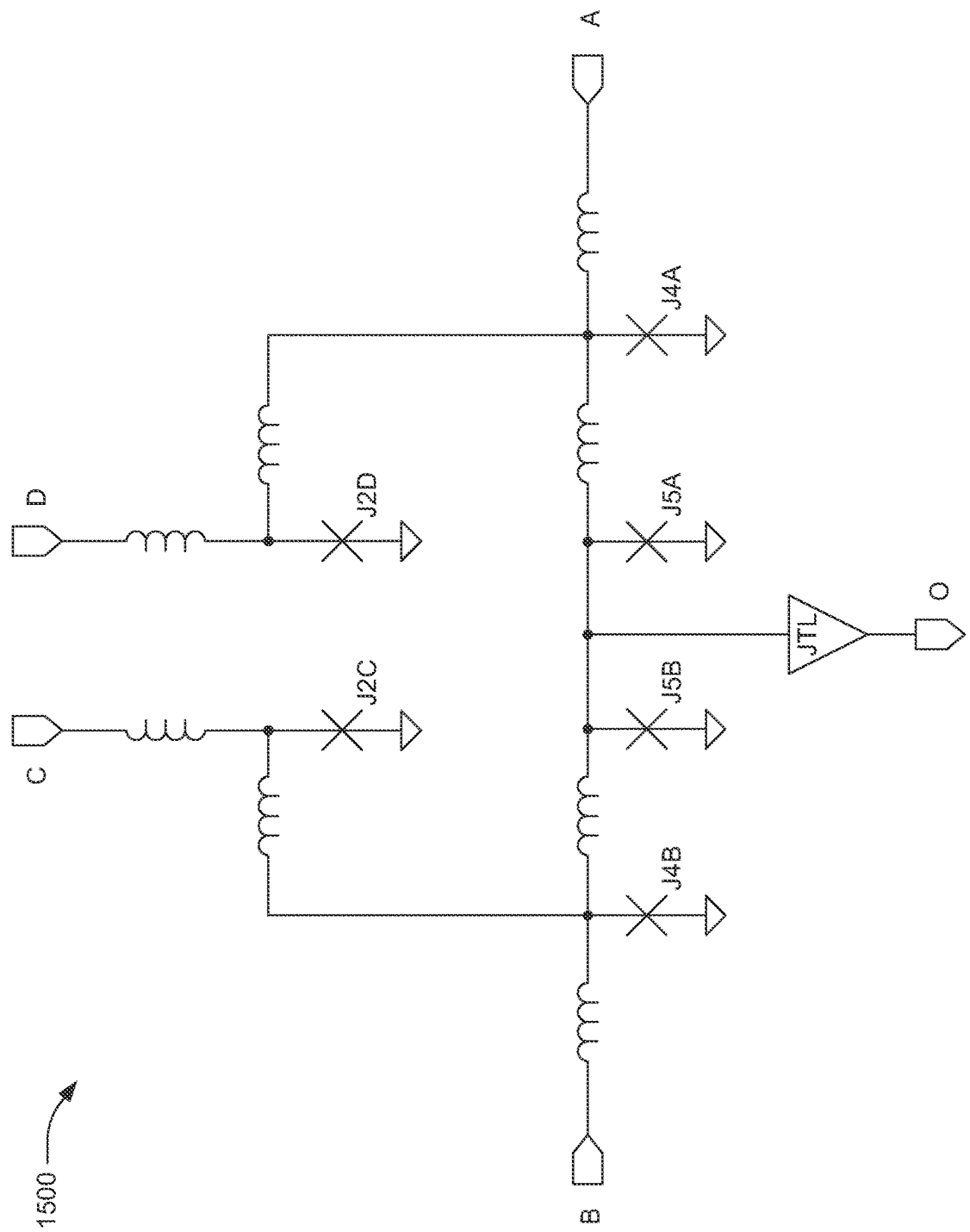
FIG. 15 is a circuit diagram of an example RQL AND-OR gate.
Figure 16:
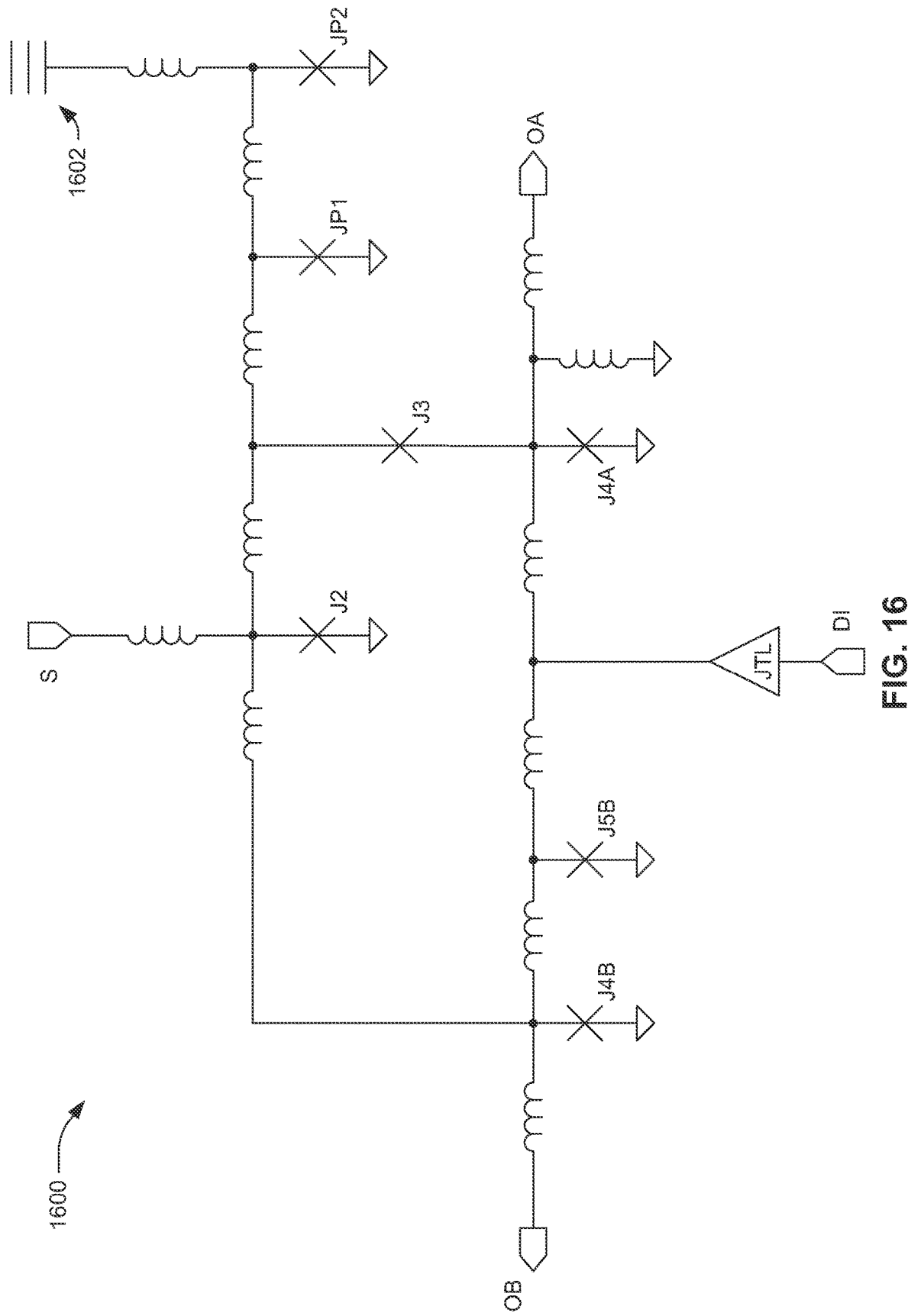
FIG. 16 is a circuit diagram of an example RQL demultiplexer.

The body-tail topologies described above can be adapted to create new combinational logic gate circuits, such as those illustrated in FIGS. 14-16. Primitive gates are also described with reference to FIGS. 17-19.

As one example, FIG. 14 illustrates a multiplexer circuit 1400 composed of two tail structures arranged to perform two AND functions on the left and right sides of circuit 1400, with a pulse generator portion of the circuit 1400 at the upper-right of FIG. 14 providing an invert function. Assertion of selector input S sends a signal provided at input B to output O, while de-assertion (or non-assertion) of selector input S sends a signal provided at input A to output O. Asymmetric multiplexer circuit 1400 is organized as two logical halves: an AND half on the left and an A-NOT-B half on the right. Selector input S splits between left and right paths from Josephson junction J2, where it either goes through an inversion via escape Josephson junction J3 to Josephson junction J4A on the right path, or non-inversion through to Josephson junction J4B on the left path.

Pulse generator Josephson junctions JP1 and JP2, fed with an AC bias from AC bias source 1402, aid in the inversion process at escape Josephson junction J3. Pulse generator Josephson junctions JP1 and JP2 are biased to spontaneously trigger positively and reciprocally every clock cycle. When selector input S is asserted "high" with a positive SFQ pulse, Josephson junction J2 triggers, splitting bias current toward both left and right paths. This bias current, combined with clock pulse current via Josephson junctions JP1 and JP2, causes escape Josephson junction J3 to trigger, eliminating provision of a pre-critical bias current to Josephson junction J4A that would otherwise permit SFQ pulses applied at input A to propagate left and out through output O. The pulse generator portion of circuit 1402 formed from Josephson junctions JP1 and JP2 and AC bias source 1402, combined with escape Josephson junction J3, effectively performs a NOT-S inversion of the selector signal in order to provide multiplexer functionality. On the left side of circuit 1400, when selector input S is asserted, bias current from Josephson junction J2 applies a pre-critical bias current to Josephson junction J4B, thus permitting SFQ pulses applied at input B to triggers Josephson junction J4B, in turn triggering Josephson junction J5B, and sending the B-input pulses out the output.

When selector input S is unasserted ("low") to select input A as the source for output O, Josephson junction J2 does not trigger, such that, on the left side of the circuit, Josephson junction J4B is deprived of biasing current needed to allow pulses provided at input B to propagate rightward toward output O, and such that, on the right side of the circuit, the pulse generator at upper right provides bias to Josephson junction J4A so that pulses introduced at input A are propagated to output O. In contrast to an RQL multiplexer circuit made from primitive AND and inverter gates, circuit 1400 greatly improves component economy and thus circuit density and cost.

Figure 17:
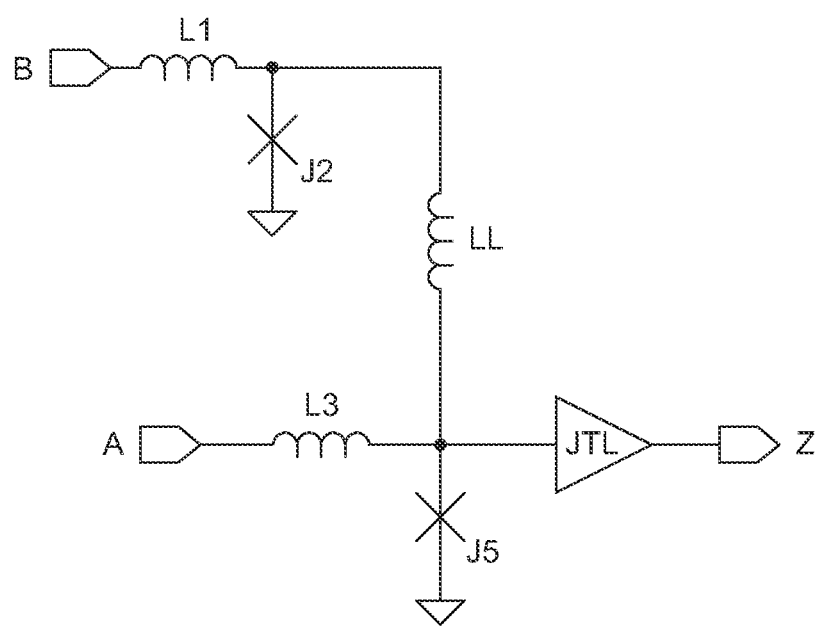
FIG. 17 is a circuit diagram of an example RQL AND gate.

As another example, FIG. 15 illustrates an AND-OR gate circuit 1500 provided as a combination of two AND primitive gates (as shown in FIG. 17) with the outputs logically OR'd together in a similar fashion to what is demonstrated with multiplexer 1400 of FIG. 14. Instead of having selector input S, as in circuit 1400 of FIG. 13, AND-OR gate circuit 1500 has two inputs at the top, input C and input D, to provide the logical function O=(A AND D) OR (B AND C). No inversion is needed on either input C or D, so the circuit does not include the pulse generator portion found in multiplexer circuit 1400. Assertion of input C with a positive SFQ pulse to send that input "high" enables pulses provided at input B to propagate to output O. Likewise, assertion of input D with a positive SFQ pulse to send that input "high" enables pulses provided at input A to propagate to output O.

As yet another example, FIG. 16 illustrates a demultiplexer gate circuit 1600 similar in structure to multiplexer 1400 of FIG. 14 but with the direction of the data path reversed, such that output O from multiplexer circuit 1400 is arranged instead as data input DI in demultiplexer circuit 1600, and inputs A and B from circuit 1400 are arranged as outputs OA and OB, respectively, in demultiplexer circuit 1600. The selector input S remains the same as in circuit 1400. Input DI splits between two paths to Josephson junctions J4A and J4B. Based on the assertion value of the selector input S, SFQ pulses applied at data input DI are propagated either to output OA or to output OB, but not to both. Assertion of selector input S (to send it "high") bias Josephson junction J4B, and de-biases Josephson junction J4A, allowing signals applied at data input DI propagate to the left, to output OB. Conversely, if select input S is unasserted ("low"), Josephson junction J4B is no longer biased, blocking the propagation of data input signals toward output OB, and biasing Josephson junction J4A with current from the pulse generator portion at the upper right of circuit 1600, such that signals applied at data input DI are steered to the right, to output OA. Demultiplexor 1600 offers simplicity and scalability of use in decoders.

FIG. 17 provides an AND gate circuit 1700 according to the body-tail topology described herein, where the body stage is reduced to a single input B and associated inductor L1 and Josephson junction J2, which body stage supplies a pre-critical bias current to tail stage Josephson junction J5 via linking inductor LL. With a positive SFQ pulse at input A to assert that input, Josephson junction J5 triggers and produces an output of "1" at output Z, fulfilling the AND logical function of Z=A AND B.

Figure 18:
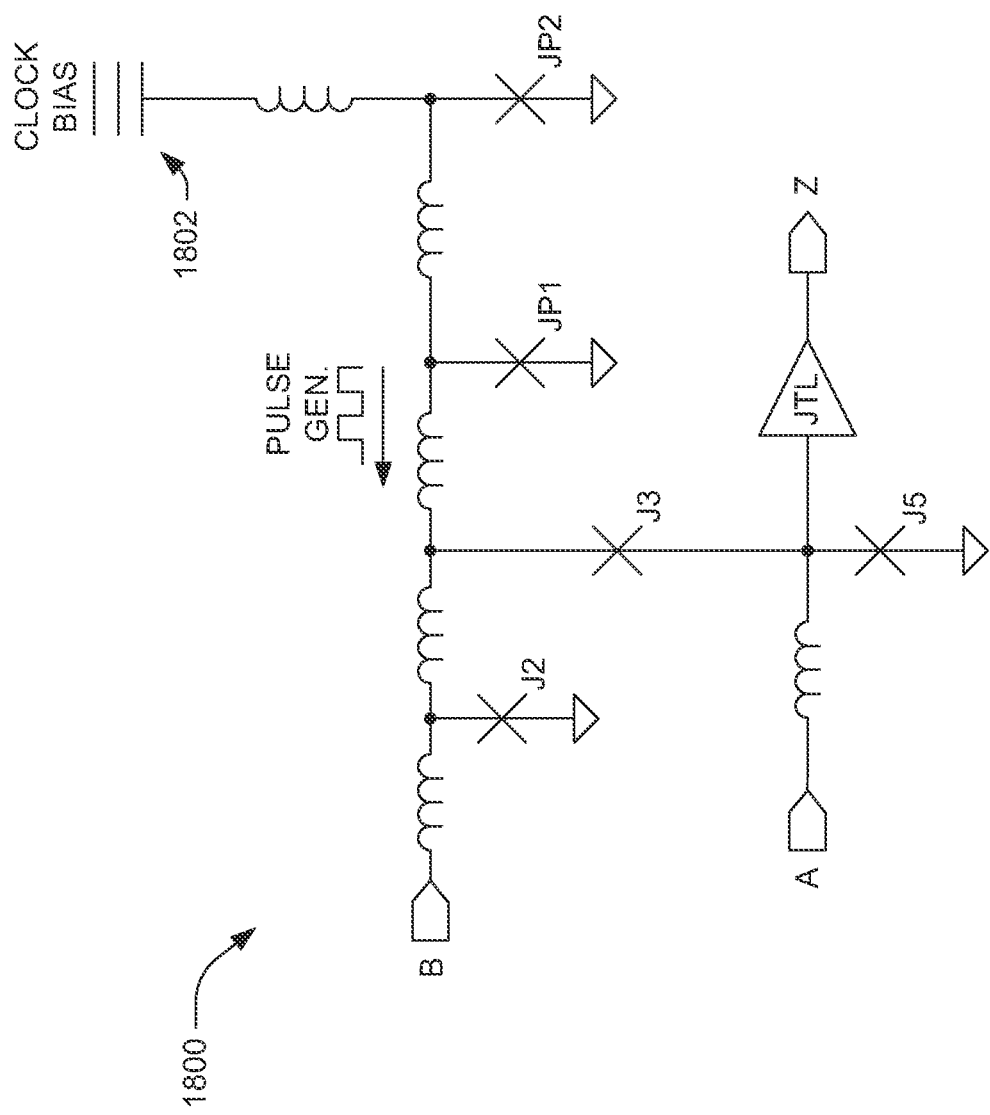
FIG. 18 is a circuit diagram of an example RQL A-NOT-B gate.

FIG. 18 provides an A-NOT-B gate circuit 1800 sharing structural similarities to the multiplexer circuit 1400 described previously. The upper-right portion of the circuit provides a pulse generator signal, indicated in FIG. 18 as "PULSE GEN.," as a return-to-zero (RZ) tie-high signal. When combined with an assertion signal ("1") provided at input B, the pulse generator signal causes escape Josephson junction J3 to trigger, thereby starving tail Josephson junction J5 of a pre-critical bias current that would otherwise allow SFQ pulses provided at input A to propagate to output Z. Thus, when input B is "high," input A pulses are blocked. In absence of a "1" on input B, circuit 1800 allows for the pulse generator to provide the requisite pre-critical bias current to tail Josephson junction J5, thereby activating input A to trigger tail Josephson junction J5 and thus produce a "1" at the output Z.

Figure 19:
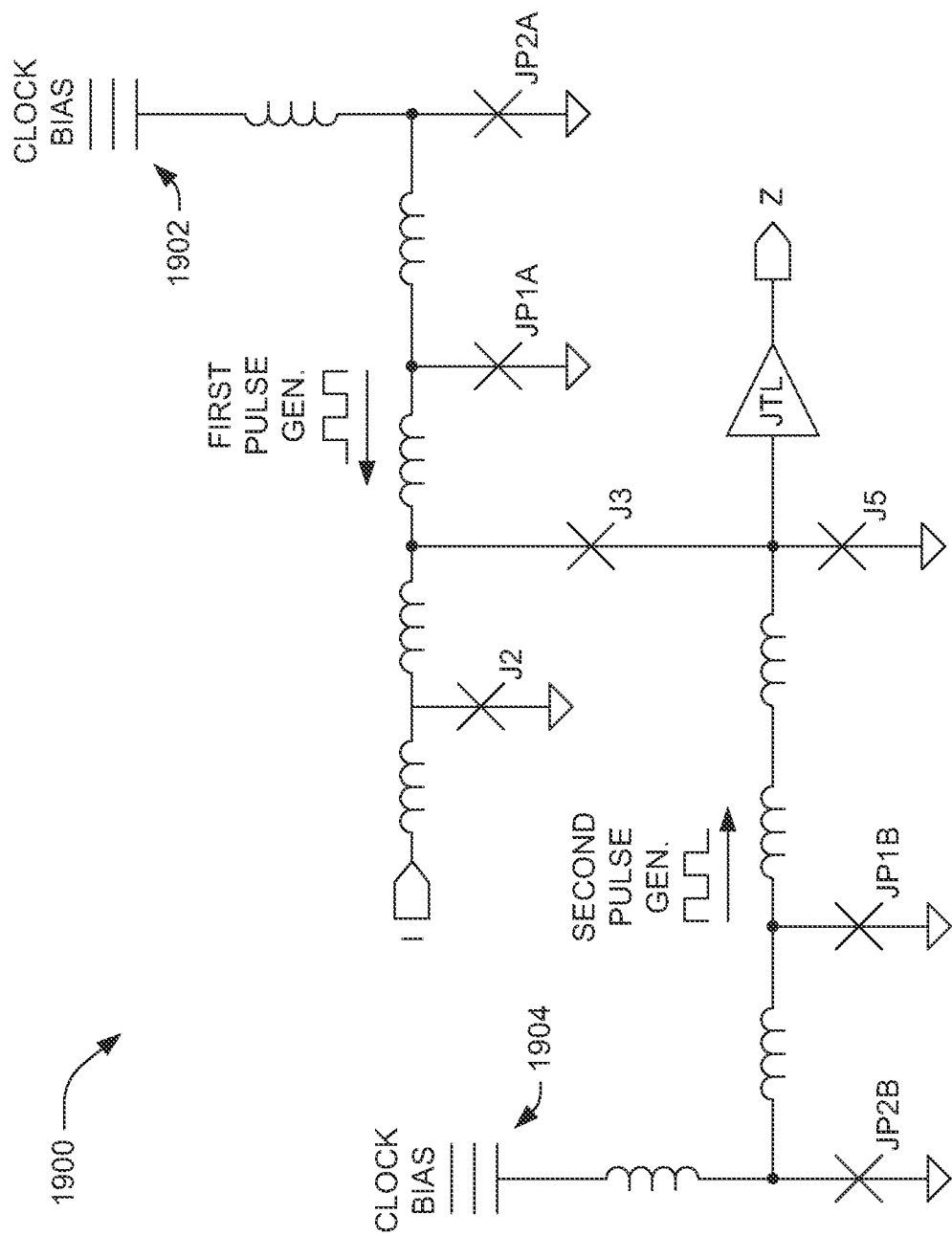
FIG. 19 is a circuit diagram of an example RQL inverter (NOT gate).

FIG. 19 provides an inverter 1900, otherwise known as a NOT gate, similar in structure to the A-NOT-B gate 1800 of FIG. 18, except that the input A is replaced with a second pulse generator circuit portion that includes Josephson junctions JP1B and JP2B. When combined with an assertion signal ("1") provided at input I, the first pulse generator signal (from first pulse generator circuit portion including Josephson junctions JP1A and JP2A and AC bias source 1902) causes escape Josephson junction J3 to trigger, thereby starving tail Josephson junction J5 of a pre-critical bias current that would otherwise allow second pulse generator SFQ pulses provided from second pulse generator (including Josephson junctions JP1B and JP2B and AC bias source 1904) to propagate to output Z. Thus, when input I is "high," pulses are blocked from output Z, and when input I is "low," pulses are propagated to output Z. As such, circuit 1900 accomplishes RQL signal inversion at a relatively low component cost of seven Josephson junctions and nine inductors, plus those in any output JTL (as illustrated) and without requiring any physically large and high-efficiency transformers as may be involved in other RQL inverter designs.

Figure 20:
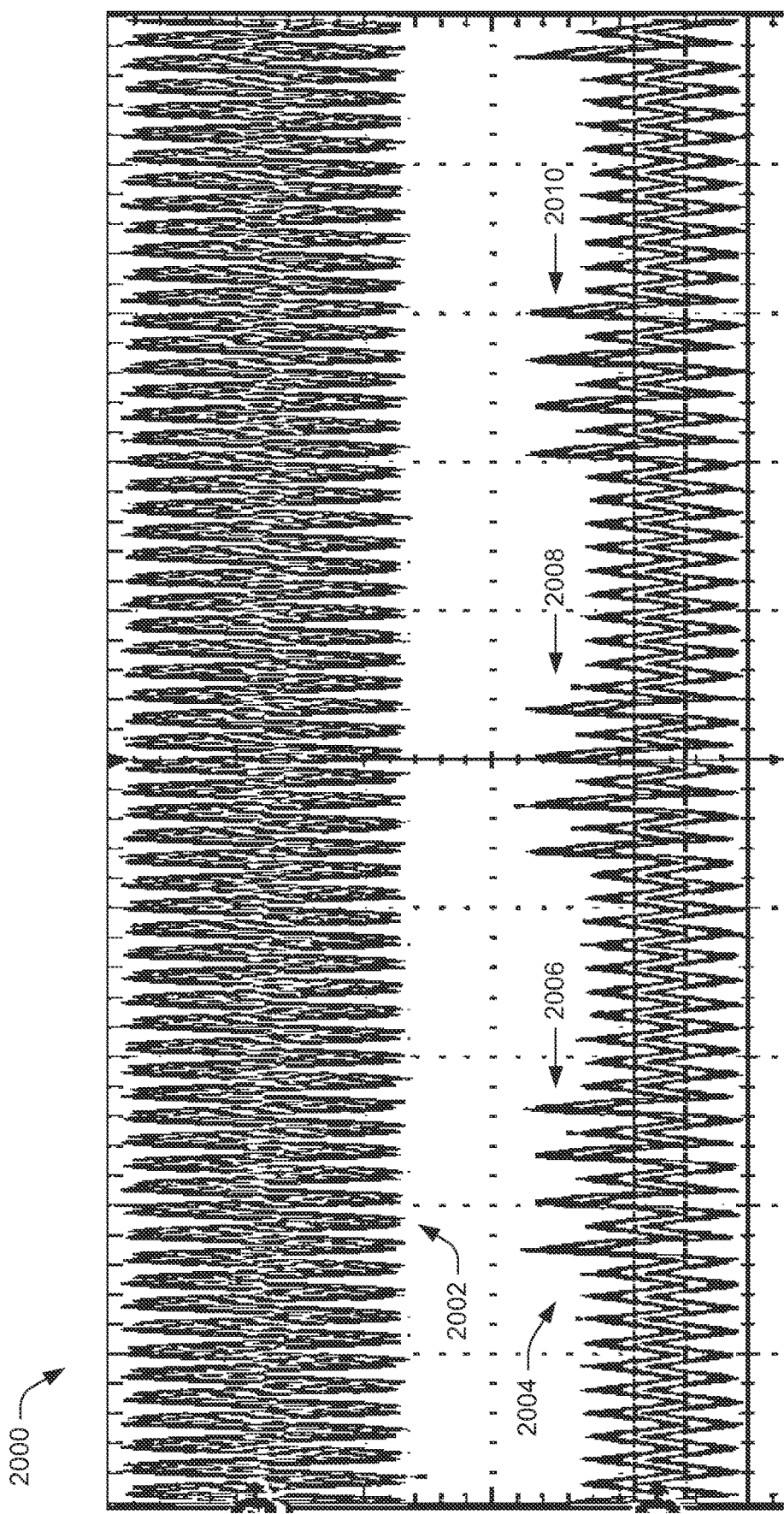
FIG. 20 is an oscilloscope screenshot capture of measured waveforms for the RQL single-read NDRO register circuit of FIG. 7.

FIG. 20 displays an oscilloscope screen capture 2000 from a successful test of latch-based NDRO circuit 700. The waveforms on the upper half of the plot 2002 show the I and Q clock, while the waveform on the lower half of the plot 2004 show the non-destructive readout output. The oscilloscope screen capture demonstrates the correct response from an NDRO memory cell to a series of commands switching the D-latch from a logical "0" state to a logical "1" state under a variety of half-select and full-select conditions on back-to-back clock cycles. This also includes simultaneous operations of write and read within same cycle. There are a total of eight read commands: four while storing a logical "0" state and four of a logical "1" state, resulting in the four logical "1" outputs 2006 that are displayed. The series of commands is repeated three times, 2006, 2008, 2010, for the screen capture shown.

Circuits 100, 700, 900, 1100, and 1200 can form the basis of RQL register file or other memory designs. In particular, the dual-port (or, more generally, multi-port) read functionality of circuits 100, 900, and 1200 provide the capability greatly simplify register files for CPUs and caches, which require such multi-port output. These circuits therefore enable much more compact register file architectures than previously possible. A "register file" is a hardware array of processor registers in a central processing unit (CPU). Apart from memory, register files are very close to the computation unit in the CPU layout and they require very fast access and multiple ports, reading in many directions. When a circuit 100, 700, 900, 1100, or 1200 serves as a memory element in an array of such circuits, DI can serve as a data input, LCLK can serve as a word write enable, and NDRO can serve as a word read enable. Word write enable lines and word read enable lines can run parallel across the bit-length of a word in the memory. These signals can run orthogonal to the write bit lines and read bit lines, which can run along the word dimension. Thus, in an array of such memory elements, word write enable lines can be connected to LCLK inputs of the respective elements and word read enable lines can be connected to NDRO inputs of the respective elements, while bit write data lines can be connected to the DI inputs of the respective elements, and bit read data lines can be connected to the QO outputs of the respective elements (to use the signal line nomenclature of FIGS. 6-7).

Figure 21:
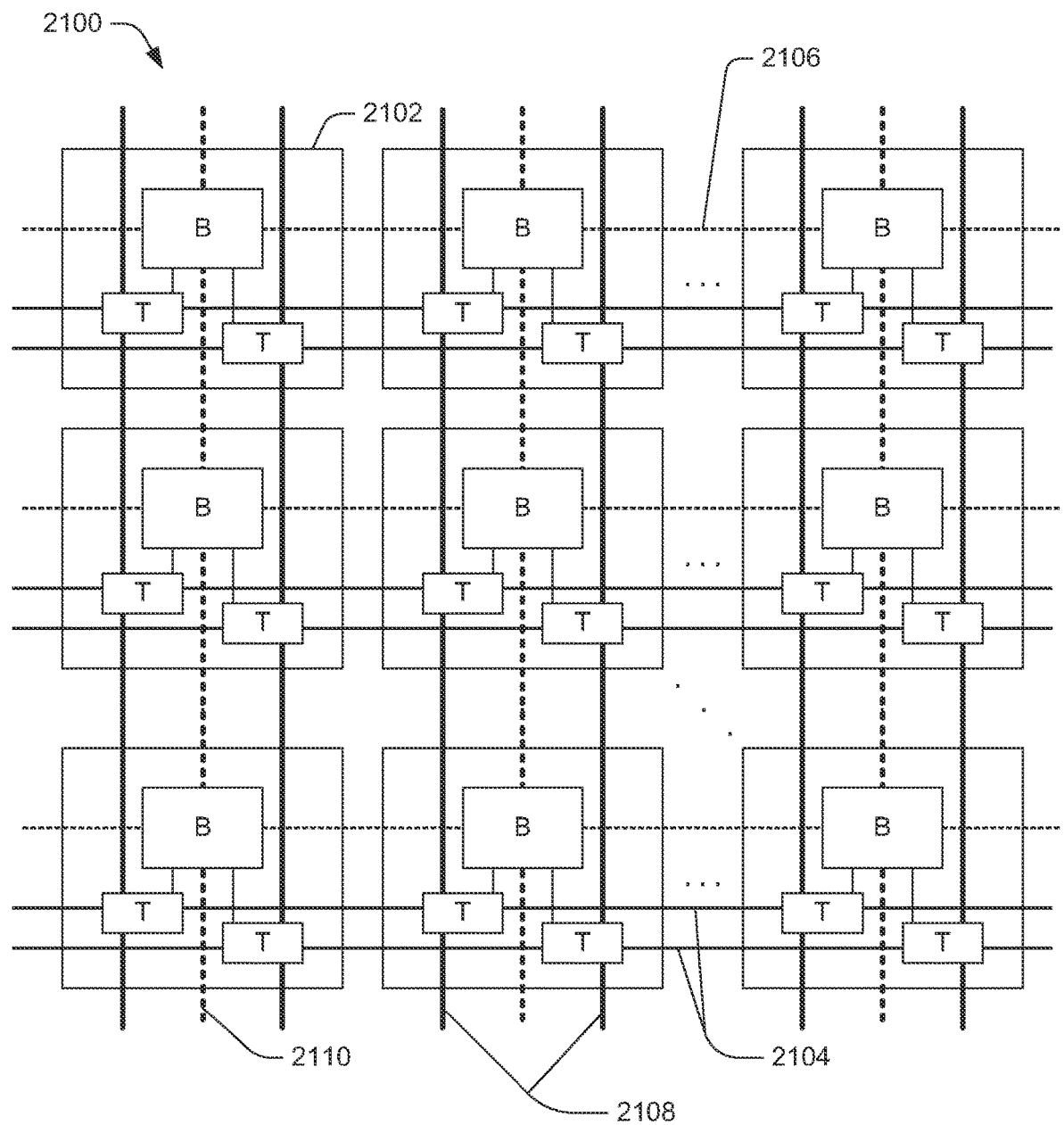
FIG. 21 is a block diagram of an example array of multi-tail NDRO gates.

Thus, FIG. 21 shows an example of an array 2100 of multi-tail NDRO gates 2102 arranged as memory or logic elements, each of which can correspond, for example, to any of circuits 100, 900, 1200, or a multi-tail version of circuit 1300 as described above. Each gate 2102 can have a body B and multiple tails T. Read lines are illustrated as solid and write lines are illustrated as dashed. Word lines are illustrated as thin horizontal lines and bit lines are illustrated as thick vertical lines. Word read enable lines 2104 are represented as thinner solid lines each connecting to the NDRO inputs of tails T in a row. Word write enable lines 2106 are represented as thinner broken lines each connecting to the LCLK inputs of bodies B in a row. Bit read data lines 2108 are represented as thicker solid lines each connecting to the QO outputs of tails T in a column. Bit write data lines 2110 are represented as thicker broken lines each connecting to the DI inputs of bodies B in a column. While the bit lines are defined as columns and word lines as rows in this particular image, this arrangement is arbitrary and could be reversed. Other connections (e.g., for AC clocks or ground) are omitted from FIG. 21 for clarity. The array 2100 can be of any suitable size (i.e., having any number of columns and rows), and can be used as a memory or as a logic array, e.g., a programmable logic array (PLA) or field-programmable gate array (FPGA) to output evaluated logic functions. In the illustrated example of FIG. 21, two word read enable lines 2104 are associated with each row of NDRO gates 2102 and two bit read data lines 2108 are associated with each column of NDRO gates 2102, but the number of such lines can correspond to the number of tails in each NDRO gate 2102 and thus can be fewer or greater than two.

The examples described herein provide for memory cells, logic cells, registers, register files, memory arrays, logic arrays, logic gates, and logic structures of higher performance, higher speed, reduced device count (e.g., fewer Josephson junctions and inductors), and greater functionality than existing designs. The examples provide efficient, compact cells for AND, A-NOT-B, and inverter logical functions, and for gates such as multiplexer, demultiplexer, and AND-OR gates. The examples also lead to more compact memory unit cells demanding less resources with increased functionality (e.g., the capability to write and read at the same time).

The NDRO circuits and other gates described herein have very good parametric operating margins, a low component count, and provide efficiency and cost advantages as compared to other implementations. As one example, by eliminating high-efficiency transformers as compared to other designs, the NDRO circuits and other gates described herein can save a number of metal layers, e.g., two metal layers, in the fabrication process, which sets the number of process steps and yield and thereby determines cost. As another example, by not using non-transformer-based, direct-coupled designs that contain negligible numbers of transformers, the NDRO circuits and other gates described herein avoid high device counts and large inductances.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements.

As used herein, the term "includes" means includes but not limited to, and the term "including" means including but not limited to. The term "based on" means based at least in part on.

What is claimed is:

1. A reciprocal quantum logic (RQL) central processing unit (CPU) comprising:
    a memory comprising an array of RQL non-destructive readout (NDRO) gate circuits, each NDRO gate circuit comprising a body circuit comprising one of a D latch or a D flip-flop configured to store a logical state, the body circuit being coupled to at least two tail circuits in the NDRO gate circuit and configured to supply a pre-critical state current to a respective tail Josephson junction in each of the at least two tail circuits, each pre-critical state current being representative of the stored logical state;
    wherein each tail circuit is configured to propagate to an NDRO output port of the respective tail circuit an output signal corresponding to the logical AND of the stored logical state with a respective NRDO read enable signal provided to an NDRO input port of the respective tail circuit, and
    wherein the propagation of any output signal from any of the tail circuits does not affect the logical state stored in the body circuit connected to said tail circuits.

2. The RQL CPU of claim 1, wherein each NDRO gate circuit in the array is configured to have its logical state both writable and readable in the same operation cycle.

3. The RQL CPU of claim 1, wherein the memory is a register file.

4. The RQL CPU of claim 1, wherein the memory is configured as a programmable logic array.

5. The RQL CPU of claim 1, wherein the memory is configured as a field-programmable gate array.

6. The RQL CPU of claim 1, wherein at least one of the tail circuits comprises:
    a tail input inductor connected between an NDRO read-enable input port and the body circuit and configured to receive an SFQ pulse NDRO read-enable signal on the NDRO read-enable input port;
    a tail Josephson junction connected between the body circuit and a circuit ground; and
    a tail output inductor connected between the body circuit and an NDRO output port and configured to transmit an SFQ pulse NDRO output signal based on the stored logical state and the NDRO read-enable signal without affecting the stored logical state.

7. The RQL CPU of claim 6, wherein the at least one of the tail circuits comprises no more than one Josephson junction and no more than two inductors, exclusive of any output Josephson transmission line (JTL) connected to the tail output inductor.

8. The RQL CPU of claim 6, wherein at least one of the body circuits comprises a D latch having a data input port and a logical clock input port each configured to receive SFQ pulses, the D latch comprising:
    a data input inductor connected between the data input port and a first node;
    a data input Josephson junction connected between the first node and the circuit ground;
    a state storage Josephson junction connected between a second node and the circuit ground;
    a first DC flux bias transformer connected between a third node and the first node and to a DC flux bias line;

a second DC flux bias transformer connected between the second node and the third node and to the DC flux bias line;

a logical clock input inductor connected between the logical clock input port and a fourth node;

an escape Josephson junction connected between the fourth node and the second node; and at least one linking inductor connected between the third node and at least one of the at least two tail circuits connected to the at least one of the body circuits, wherein the first and second DC flux bias transformers are configured to provide at an initialization time a fraction of a $\Phi_0$ of phase to the data input Josephson junction and the state storage Josephson junction.

9. The RQL CPU of claim 6, wherein at least one of the body circuits comprises a D latch having a data input port and a logical clock input port each configured to receive SFQ pulses, the D latch comprising:

a data input inductor connected between the data input port and a first node;

a data input Josephson junction connected between the first node and the circuit ground;

a state storage Josephson junction connected between a second node and the circuit ground;

only a single DC flux bias transformer connected between the second node and the first node and to a DC flux bias line;

a logical clock input inductor connected between the logical clock input port and a fourth node;

an escape Josephson junction connected between the fourth node and the second node;

a first linking inductor connected between the first node and at least one of the at least two tail circuits connected to the at least one of the body circuits; and a second linking inductor connected between the second node and the at least one of the at least two tail circuits, wherein the single DC flux bias transformer is configured to provide at an initialization time a fraction of a $\Phi_0$ of phase to the data input Josephson junction and the state storage Josephson junction.

10. The RQL CPU of claim 6, wherein at least one of the body circuits comprises a D flip-flop having a data input port and a logical clock input port each configured to receive SFQ pulses, the D flip-flop comprising:

a data input inductor connected between the data input port and a first node;

a data input Josephson junction connected between the first node and the circuit ground;

a state storage Josephson junction connected between a second node and the circuit ground;

a first inductor connected between a third node and the first node;

a second inductor connected between the second node and the third node;

a logical clock input inductor connected between the logical clock input port and a fourth node;

an escape Josephson junction connected between the fourth node and the second node; and at least one linking inductor connected between the third node and at least one of the at least two tail circuits connected to the at least one of the body circuits, wherein the D flip-flop does not include a DC flux bias transformer connected to a DC flux bias line.

11. The RQL CPU of claim 1, wherein at least one of the tail circuits comprises no more than one Josephson junction and no more than two inductors, exclusive of any output Josephson transmission line (JTL) connected to the tail output inductor.

12. The RQL CPU of claim 1, wherein at least one of the body circuits comprises a D latch having a data input port and a logical clock input port each configured to receive SFQ pulses, the D latch comprising:

a data input inductor connected between the data input port and a first node;

a data input Josephson junction connected between the first node and the circuit ground;

a state storage Josephson junction connected between a second node and the circuit ground;

a first DC flux bias transformer connected between a third node and the first node and to a DC flux bias line;

a second DC flux bias transformer connected between the second node and the third node and to the DC flux bias line;

a logical clock input inductor connected between the logical clock input port and a fourth node;

an escape Josephson junction connected between the fourth node and the second node; and at least one linking inductor connected between the third node and at least one of the at least two tail circuits connected to the at least one of the body circuits, wherein the first and second DC flux bias transformers are configured to provide at an initialization time a fraction of a $\Phi_0$ of phase to the data input Josephson junction and the state storage Josephson junction.

13. The RQL CPU of claim 12, wherein at least one of the tail circuits comprises no more than one Josephson junction and no more than two inductors, exclusive of any output Josephson transmission line (JTL) connected to the tail output inductor.

14. The RQL CPU of claim 1, wherein at least one of the body circuits comprises a D latch having a data input port and a logical clock input port each configured to receive SFQ pulses, the D latch comprising:

a data input inductor connected between the data input port and a first node;

a data input Josephson junction connected between the first node and the circuit ground;

a state storage Josephson junction connected between a second node and the circuit ground;

only a single DC flux bias transformer connected between the second node and the first node and to a DC flux bias line;

a logical clock input inductor connected between the logical clock input port and a fourth node;

an escape Josephson junction connected between the fourth node and the second node;

a first linking inductor connected between the first node and at least one of the at least two tail circuits connected to the at least one of the body circuits; and a second linking inductor connected between the second node and the at least one of the at least two tail circuits, wherein the single DC flux bias transformer is configured to provide at an initialization time a fraction of a $\Phi_0$ of phase to the data input Josephson junction and the state storage Josephson junction.

15. The RQL CPU of claim 14, wherein at least one of the tail circuits comprises no more than one Josephson junction and no more than two inductors, exclusive of any output Josephson transmission line (JTL) connected to the tail output inductor.

16. The RQL CPU of claim 1, wherein at least one of the body circuits comprises a D flip-flop having a data input port and a logical clock input port each configured to receive SFQ pulses, the D flip-flop comprising:
- a data input inductor connected between the data input port and a first node;
- a data input Josephson junction connected between the first node and the circuit ground;
- a state storage Josephson junction connected between a second node and the circuit ground;
- a first inductor connected between a third node and the first node;
- a second inductor connected between the second node and the third node;
- a logical clock input inductor connected between the logical clock input port and a fourth node;
- an escape Josephson junction connected between the fourth node and the second node; and
- at least one linking inductor connected between the third node and at least one of the at least two tail circuits connected to the at least one of the body circuits,
- wherein the D flip-flop does not include a DC flux bias transformer connected to a DC flux bias line.

17. The RQL CPU of claim 16, wherein at least one of the tail circuits comprises no more than one Josephson junction and no more than two inductors, exclusive of any output Josephson transmission line (JTL) connected to the tail output inductor.

* * * * *